United States Patent
Hosoya et al.

(10) Patent No.: US 9,082,724 B2
(45) Date of Patent: Jul. 14, 2015

(54) LIGHTING DEVICE

(75) Inventors: Kunio Hosoya, Kanagawa (JP); Hideki Matsukura, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 189 days.

(21) Appl. No.: 13/399,061

(22) Filed: Feb. 17, 2012

(65) Prior Publication Data

US 2012/0211775 A1      Aug. 23, 2012

(30) Foreign Application Priority Data

Feb. 21, 2011   (JP) ................................. 2011-034160

(51) Int. Cl.
  *H01L 51/52*   (2006.01)
  *H01L 27/32*   (2006.01)

(52) U.S. Cl.
  CPC ........ *H01L 27/3202* (2013.01); *H01L 27/3204* (2013.01); *H01L 27/3239* (2013.01); *H01L 2251/5361* (2013.01)

(58) Field of Classification Search
  CPC .. H01L 51/5012; H01L 51/52; H01L 51/5203
  USPC ................. 257/40, E51.02, E51.018
  See application file for complete search history.

(56) References Cited

U.S. PATENT DOCUMENTS

| | | | |
|---|---|---|---|
| 7,301,171 B2 | 11/2007 | Osame et al. | |
| 7,737,444 B2 | 6/2010 | Osame et al. | |
| 7,753,751 B2 | 7/2010 | Yamazaki | |
| 7,999,463 B2 | 8/2011 | Nomura | |
| 2004/0251818 A1* | 12/2004 | Duggal et al. | 313/504 |
| 2008/0129184 A1 | 6/2008 | Nishida et al. | |
| 2010/0019253 A1* | 1/2010 | Kim et al. | 257/88 |
| 2011/0089814 A1 | 4/2011 | Nomura | |
| 2011/0089823 A1 | 4/2011 | Nomura | |
| 2011/0101388 A1 | 5/2011 | Nomura | |
| 2011/0140617 A1 | 6/2011 | Nomura | |
| 2012/0112220 A1* | 5/2012 | West et al. | 257/98 |

FOREIGN PATENT DOCUMENTS

| | | |
|---|---|---|
| JP | 2004-69774 | 3/2004 |
| JP | 2006-108651 | 4/2006 |

* cited by examiner

*Primary Examiner* — Minchul Yang
(74) *Attorney, Agent, or Firm* — Husch Blackwell LLP

(57) ABSTRACT

A lighting device having a novel structure for integration of a plurality of light-emitting elements, and a manufacturing method thereof are provided. In the lighting device, a plurality of light-emitting elements is electrically connected to each other through plugs (connecting members) and a connection wiring for integration. The connection wiring is provided on a counter substrate and the plugs are provided over an element substrate or for the counter substrate. Such a connection structure enables an appropriate electrical connection between the plurality of light-emitting elements in the lighting device.

19 Claims, 27 Drawing Sheets

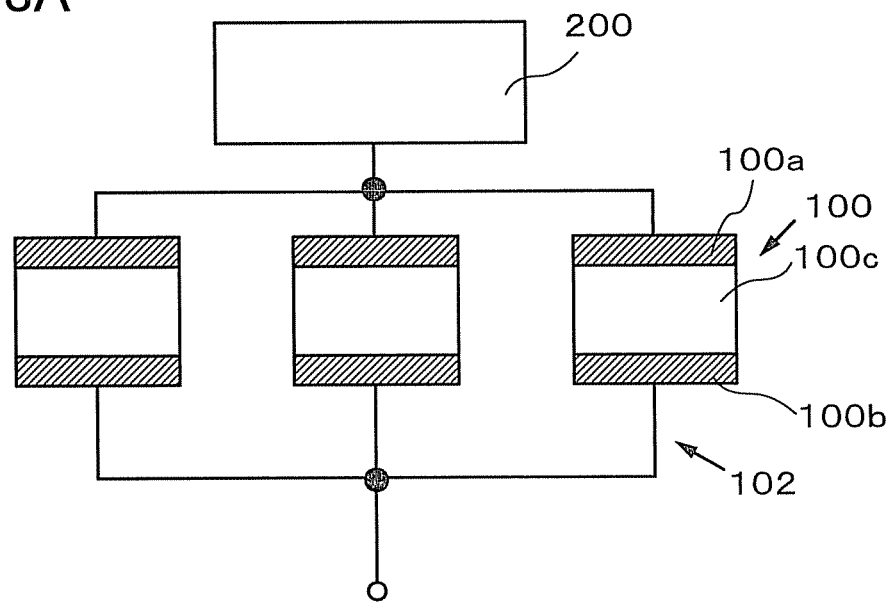
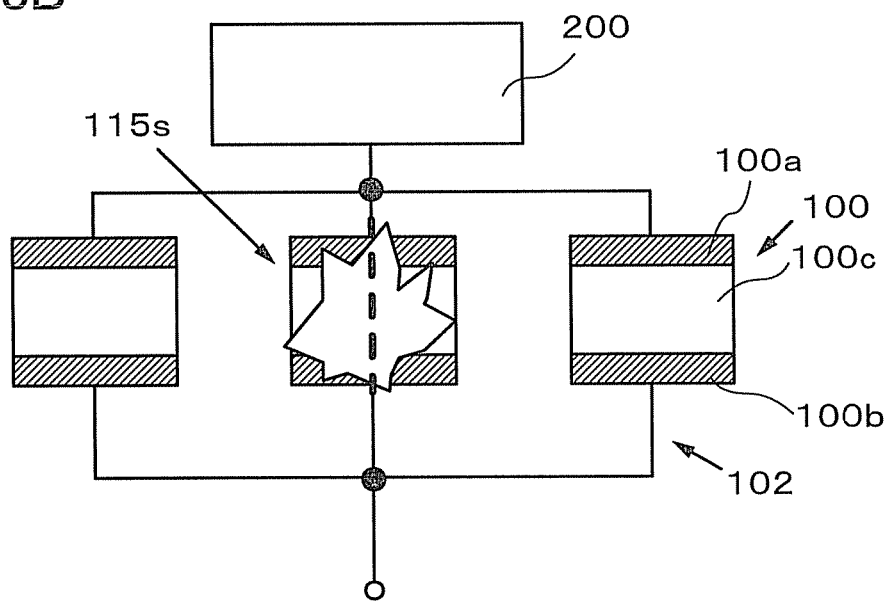

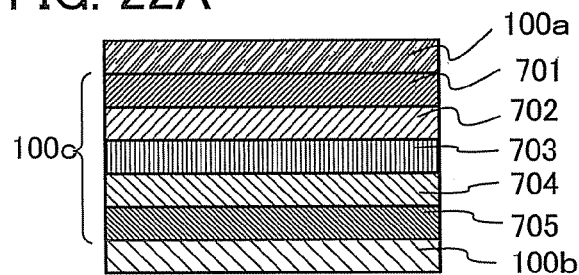
FIG. 22A
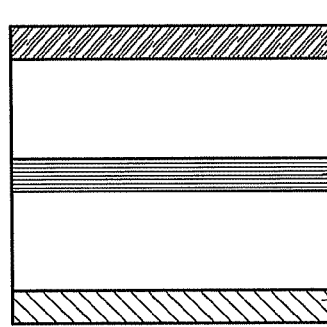
FIG. 22B1
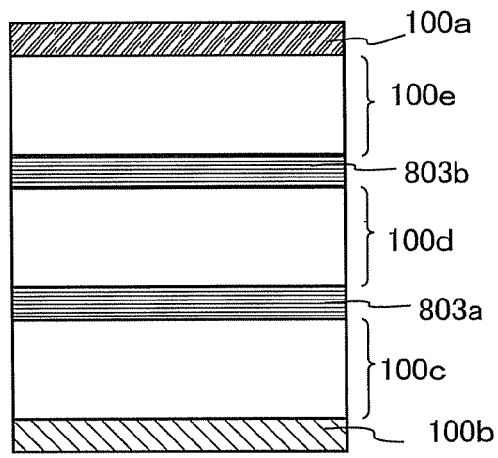
FIG. 22B2
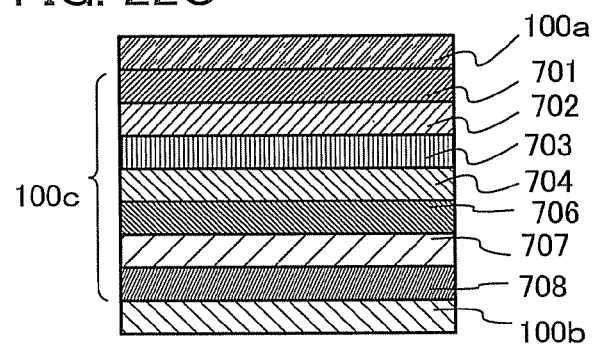
FIG. 22C FIG. 27
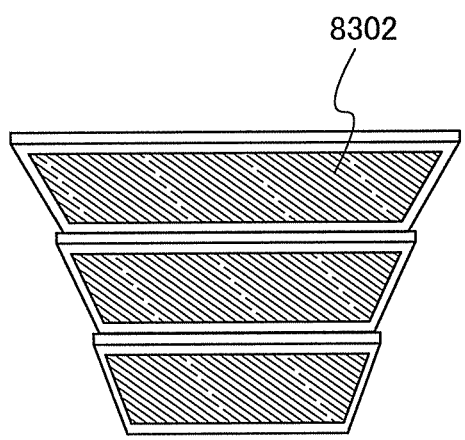
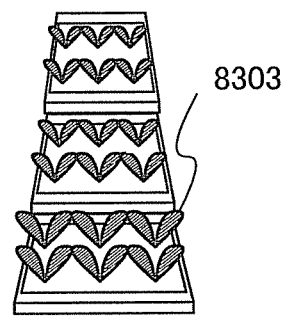

LIGHTING DEVICE

BACKGROUND OF THE INVENTION

1. Field of the Invention

The present invention relates to a lighting device or a light-emitting device which includes a light-emitting member exhibiting electroluminescence (EL).

2. Description of the Related Art

A light-emitting element containing an organic compound as a light-emitting body has been expected to be applied to next-generation lighting. A light-emitting element containing an organic compound as a light-emitting body has a feature such as drive at a low voltage with low power consumption.

An organic compound layer included in a light-emitting element includes at least a light-emitting layer. In addition, the organic compound layer can have a stacked-layer structure including a hole injection layer, a hole transport layer, an electron transport layer, an electron injection layer, and/or the like, in addition to the light-emitting layer.

It is said that, as for a light-emitting mechanism of a light-emitting element, an organic compound layer is provided between a pair of electrodes and voltage is applied to the organic compound layer, so that electrons injected from a cathode and holes injected from an anode are recombined in an emission center of the organic compound layer to form molecular excitons, and the molecular excitons release energy when returning to a ground state; thus, light is emitted. Singlet excitation and triplet excitation are known as excited states, and light emission can probably be achieved through either of the excited states.

Further, since the pair of electrodes and the light-emitting layer are formed as films in such a light-emitting element, surface light emission can easily be obtained by forming a large-area light-emitting element. This is a feature which is hard to obtain in a light source such as an incandescent lamp and an LED (point light sources) or in a fluorescent lamp (line light source), so that the above light-emitting element has a high utility value as a light source such as lighting.

Patent Document 1 discloses a structure where a plurality of light-emitting elements is connected to each other. FIG. 7B of Patent Document 1 shows that the plurality of light-emitting elements is connected to each other only through electrodes thereof.

Patent Document 2 discloses a structure where power supply input concurrently turns on a plurality of organic EL panels. FIGS. 1A and 1B of Patent Document 2 show that wiring circuits are arranged over a substrate for providing panels so as not to intersect with each other. FIGS. 2A to 2C of Patent Document 2 show that the organic EL panel is provided with an anode side current introduction terminal and a cathode side electron introduction pin.

REFERENCE

Patent Documents

[Patent Document 1] Japanese Published Patent Application No. 2006-108651

[Patent Document 2] Japanese Published Patent Application No. 2004-069774

SUMMARY OF THE INVENTION

In the structure disclosed in Patent Document 1, since the electrodes included in the light-emitting elements are connected to each other, a light-emitting element can be connected to adjacent light-emitting elements but cannot be connected to the other elements. Thus, although a plurality of light-emitting elements can be formed over the same substrate, a connection structure cannot be freely provided between the plurality of light-emitting elements.

In the structure disclosed in Patent Document 2, each of the light-emitting panels is attached to the substrate over which terminals are formed; thus, the structure is weak and the light-emitting panels cannot be arranged at high density. In addition, since there are only two pins for fixing the light-emitting panel on either the left and right side of the light-emitting panel, the light-emitting panel cannot be firmly fixed to the substrate for providing panels.

The above structures are insufficient for a lighting device which is provided with a relatively large-area light-emitting region obtained by integration of a plurality of light-emitting elements.

An object of one embodiment of the present invention is to provide a lighting device having a novel structure for integration of a plurality of light-emitting elements, and a manufacturing method thereof.

In one embodiment of the present invention, a plurality of light-emitting elements is electrically connected to each other through plugs (connecting members) and a connection wiring for integration. The connection wiring is electrically connected to the plurality of light-emitting elements through the plugs. The connection wiring is provided on a counter substrate. The plugs may be provided over an element substrate or for the counter substrate. Such a connection structure enables an appropriate electrical connection between the plurality of light-emitting elements.

An aspect of the present invention is a lighting device including a first substrate, a first light-emitting element and a second light-emitting element which are provided over the first substrate, a second substrate which faces the first substrate, and a connection wiring provided on the second substrate. The first light-emitting element and the second light-emitting element are electrically connected to each other through the connection wiring.

Another aspect of the present invention is a lighting device including a first substrate; a first light-emitting element and a second light-emitting element which are provided over the first substrate; a first plug of a connection wiring, which is provided over an upper electrode of the first light-emitting element; and a second plug of the connection wiring, which is provided over a lower electrode of the second light-emitting element.

In one embodiment of the present invention, the upper electrode of the first light-emitting element and the lower electrode of the second light-emitting element may be electrically connected to each other through the connection wiring.

In one embodiment of the present invention, the connection wiring includes the first plug and the second plug which are electrically connected to the upper electrode and the lower electrode, respectively. The first plug may be shared by the first light-emitting element and another light-emitting element.

In one embodiment of the present invention, the connection wiring includes the first plug and the second plug which are electrically connected to the upper electrode and the lower electrode, respectively. The second plug may be shared by the first light-emitting element and another light-emitting element.

In one embodiment of the present invention, the upper electrode of the first light-emitting element and an upper electrode of the second light-emitting element may be electrically connected to each other through the connection wiring.

In one embodiment of the present invention, the first light-emitting element and the second light-emitting element may have polygonal shapes or circular shapes.

One embodiment of the present invention can provide a lighting device which is provided with a relatively large-area light-emitting region obtained by integration of a plurality of light-emitting elements, and a manufacturing method thereof.

One embodiment of the present invention can provide a lighting device and a manufacturing method thereof. The lighting device includes a versatile element substrate over which light-emitting elements are formed, and the light-emitting elements can be connected to each other freely only by changing the design of a connection wiring provided on a counter substrate, for integration of a plurality of light-emitting elements.

One embodiment of the present invention can provide a lighting device which can conduct and radiate heat from light-emitting elements to the counter substrate side with the use of thermally conductive plugs (connecting members) connecting the light-emitting elements and a connection wiring provided on the counter substrate, and a method for manufacturing the lighting device.

BRIEF DESCRIPTION OF THE DRAWINGS

In the accompany drawings:

FIGS. 18A and 18B are circuit diagrams illustrating a lighting device;
FIGS. 22A, 22B1, 22B2 and 22C are views each illustrating an element structure of a light-emitting element included in a lighting device;
FIG. 27 is a diagram illustrating an application example of a lighting device.

DETAILED DESCRIPTION OF THE INVENTION

Figure 1:
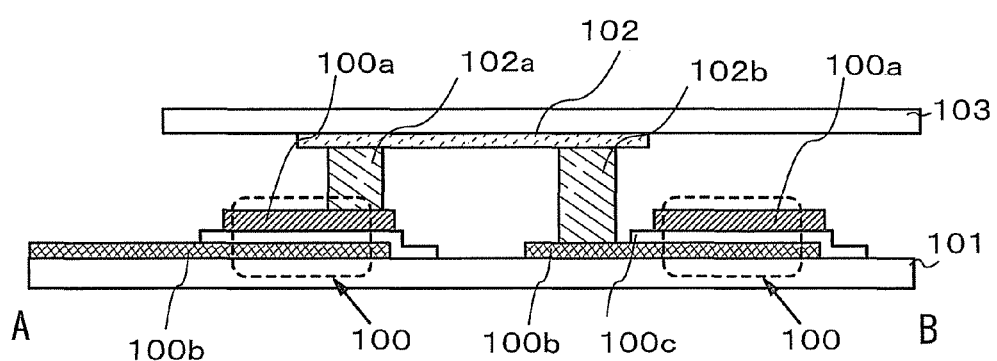
FIG. 1 is a cross-sectional view illustrating a lighting device.

Embodiments will be described in detail with reference to the drawings. However, the present invention is not limited to the following description and a variety of changes for the modes and details thereof will be apparent to those skilled in the art unless such changes depart from the spirit and the scope of the invention. The present invention should not be construed as being limited to the following description. In the structures to be given below, the same portions or portions having similar functions are denoted by the same reference numerals in different drawings, and explanation thereof will not be repeated.

(Embodiment 1)

In this embodiment, one embodiment of a lighting device of the present invention will be described.

A lighting device is illustrated in FIG. 1. FIG. 1 is a cross-sectional view of the lighting device. The lighting device includes a light-emitting element 100. A plurality of light-emitting elements 100 is provided over a first substrate 101 for integration. The light-emitting element 100 includes an upper electrode 100a, a lower electrode 100b, and an organic compound layer 100c provided therebetween. The plurality of light-emitting elements 100 is electrically connected to each other through plugs (connecting members) 102a and 102b and a connection wiring 102. For example, the upper electrode 100a of a first light-emitting element and the lower electrode 100b of a second light-emitting element are electrically connected to each other through the connection wiring 102. The connection wiring 102 is provided on a second substrate 103, for example. The connection wiring 102 is provided with the plugs 102a and 102b so that the upper electrode 100a and the lower electrode 100b can be electrically connected to each other. The plugs 102a and 102b can be formed on the upper electrode 100a and the lower electrode 100b, respectively. Alternatively, the plugs 102a and 102b can be formed on the connection wiring 102 on the second substrate 103.

In such a manner, the plurality of light-emitting elements can be electrically connected to each other through the plugs and the connection wiring.

The plurality of light-emitting elements is electrically connected to each other using the lower electrode 100b and the plug 102b on the lower electrode 100b; thus, an exposed portion (region) where the lower electrode 100b is not overlapped with the organic compound layer 100c and the upper electrode 100a in the light-emitting element is needed. It is preferable that the region be as small as possible because the region cannot contribute to light emission. The region can be minimized owing to the plug on the connection wiring. The region which cannot contribute to light emission can be smaller than in the case where an electric connection is achieved only through electrodes. As a result, emission efficiency can be enhanced.

The plurality of light-emitting elements is electrically connected to each other using the upper electrode 100a and the plug 102a on the upper electrode 100a; thus, a portion on which the plug 102a is provided is needed. It is preferable that the portion on which the plug 102a is provided be as small as possible because the portion prevents light emitted from the light-emitting element depending on the direction of the light emission of the light-emitting element. The portion can be minimized owing to the plug on the connection wiring. As a result, emission efficiency can be enhanced.

Unlike the electrode of the light-emitting element, the connection wiring 102 can be made thick. Thus, the resistance of the connection wiring 102 can be decreased.

Unlike the electrodes of the light-emitting element, the plugs 102a and 102b and the connection wirings 102 can be formed using any of the materials having low resistivity regardless of work functions. Thus, the resistance of the plugs 102a and 102b and the connection wiring 102 can be decreased.

The connection wiring 102 having resistance lower than that of the electrode of the light-emitting element functions as an auxiliary electrode.

(Embodiment 2)

In this embodiment, one embodiment of a connection structure of plugs and a connection wiring, which is included in a lighting device of the present invention, will be described.

Figure 2A:
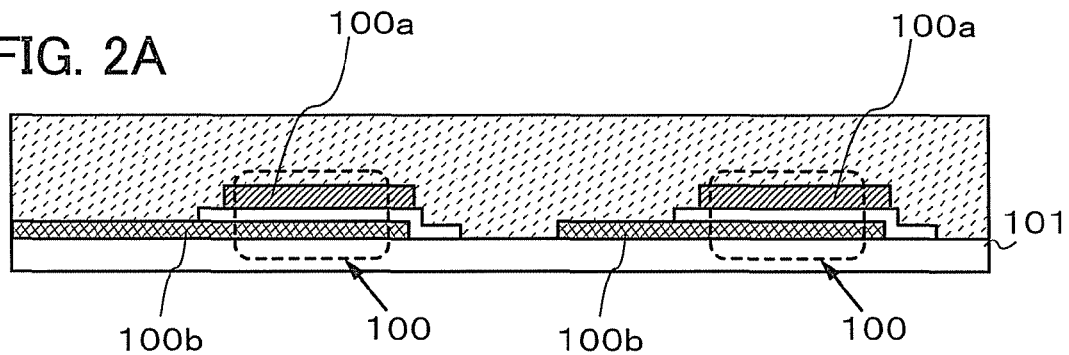
FIGS. 2A to 2C are process views illustrating a connection structure included in a lighting device.
Figure 2B:
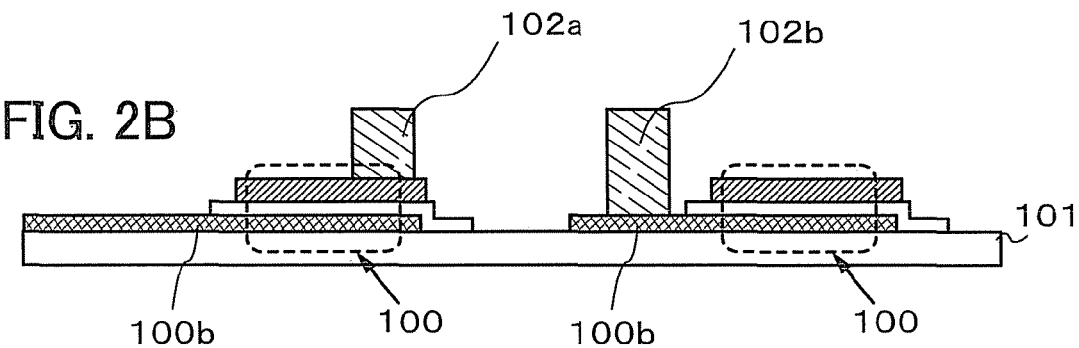
Figure 2C:
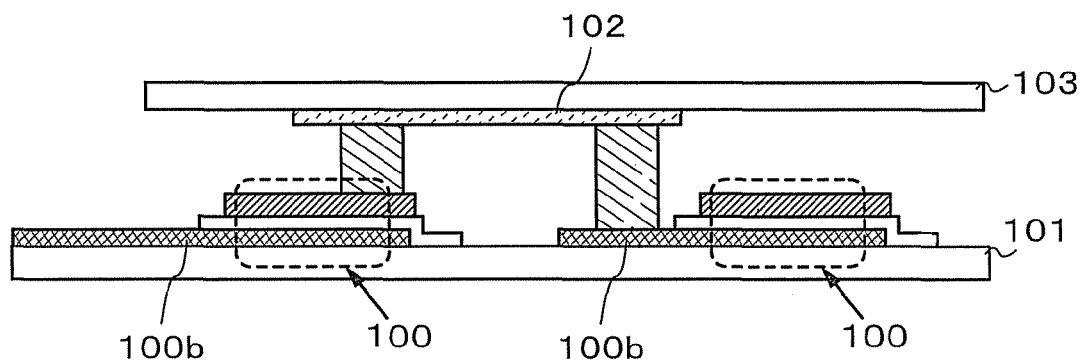

A method for forming a connection structure is illustrated in FIGS. 2A to 2C. As illustrated in FIG. 2A, the plurality of light-emitting elements 100 is provided over a glass substrate or a plastic substrate which is used as the first substrate (element substrate) 101. A conductive material film for forming the plugs is formed so as to cover the light-emitting elements 100. The conductive material can include a metal material such as aluminum, gold, silver, copper, or the like. Alternatively, the conductive material may include a copper paste or a silver paste. When a paste material is used, the plugs having desired shapes as illustrated in FIG. 2B can be obtained through a process including a printing method. Further alternatively, the conductive material may include a liquid droplet material containing copper or silver. When the liquid droplet material is used, the plugs having desired shapes as illustrated in FIG. 2B can be obtained through a process including an ink-jet method. Still further alternatively, the conductive material may include a resin material having low resistivity. When a non-photosensitive resin is used, the plugs having desired shapes as illustrated in FIG. 2B can be obtained through an exposure process with a resist. When a photosensitive resin is used, the plugs having desired shapes as illustrated in FIG. 2B can be obtained through an exposure process without a resist.

In the structure illustrated in FIG. 2B, the lower electrode 100b has a light-transmitting property so that light emitted from the light-emitting element can be extracted from the first substrate (element substrate) 101 side. This structure is called "bottom emission structure". In the case where the bottom emission structure is employed, the plugs 102a and 102b do not need to have light-transmitting properties. Further, the plug 102a does not need to be miniaturized because the plug 102a does not prevent light emitted from the light-emitting element.

Before the second substrate (counter substrate) 103 is bonded to the first substrate, each of the plugs 102a and 102b may have a shape (tapered shape) in which the thickness becomes thicker toward the upper electrode side or the lower electrode side so that the mechanical strengths of the plugs 102a and 102b are maintained. Alternatively, upper ends or lower ends of the plugs 102a and 102b may have curvature.

In other words, the upper end or the lower end can have a curved surface. With this structure, concentration of applied mechanical pressure at a specific portion can be reduced.

The lighting device with such a structure differs from a conventional structure in that the plugs 102a and 102b are provided, and the lighting device can have the above effect.

As illustrated in FIG. 2C, the second substrate (counter substrate) 103 on which the connection wiring 102 is formed is bonded to the first substrate (element substrate) 101, so that the connection wiring 102 is electrically connected to the plugs 102a and 102b. Similarly to the first substrate 101, the second substrate 103 can be formed using a glass substrate or a plastic substrate. Alternatively, a quartz substrate, a single crystal semiconductor substrate, a thin metal plate, or the like can be used. In the case where the bottom emission structure is employed, the second substrate 103 does not need to have a light-transmitting property. When a single crystal semiconductor substrate is used as the second substrate 103, a converter can be provided over the substrate. The connection wiring 102 may have conductivity, and a material selected from aluminum, copper, silver, and the like can be used. The connection wiring 102 can be formed by a photolithography method, an ink-jet method, a printing method, or the like.

When the plugs 102a and 102b have predetermined elasticity, the shapes of the plugs 102a and 102b can be changed into appropriate shapes by pressure applied during a bonding process. Contact areas between the connection wiring and the plugs can be increased owing to the changes of the shapes by pressure; thus, the connection wiring 102 can be electrically connected to the plugs 102a and 102b more certainly. In the case where the plugs 102a and 102b have the above-described tapered shapes, the plugs 102a and 102b are easily withstand excessive mechanical pressure. Further, an anisotropic conductive adhesive may be provided between the connection wiring 102 and each of the plugs 102a and 102b so that highly reliable electrical connections are formed.

The same material as the plugs 102a and 102b can be selected as a material for the connection wiring 102.

The connection wiring 102 can be formed using a material whose resistivity is lower than that of the plugs 102a and 102b. As a wiring, the connection wiring transfers power over a longer distance than the plug; thus, a wiring material having low resistivity such as copper is preferably selected.

Each of the plugs 102a and 102b can be formed using a material whose modulus of elasticity is higher than that of the connection wiring 102.

In this manner, the connection structure is formed. After that, the substrates are bonded to each other and the electrical connection is formed.

The first substrate 101 and the second substrate 103 may be formed by different manufacturers at different places. Further, the manufacturing processes before and after the bonding of the first substrate and the second substrate may be performed by different manufacturers at different places.

(Embodiment 3)

In this embodiment, one embodiment of a connection structure of plugs and a connection wiring, which is included in a lighting device of the present invention, will be described.

Figure 3:
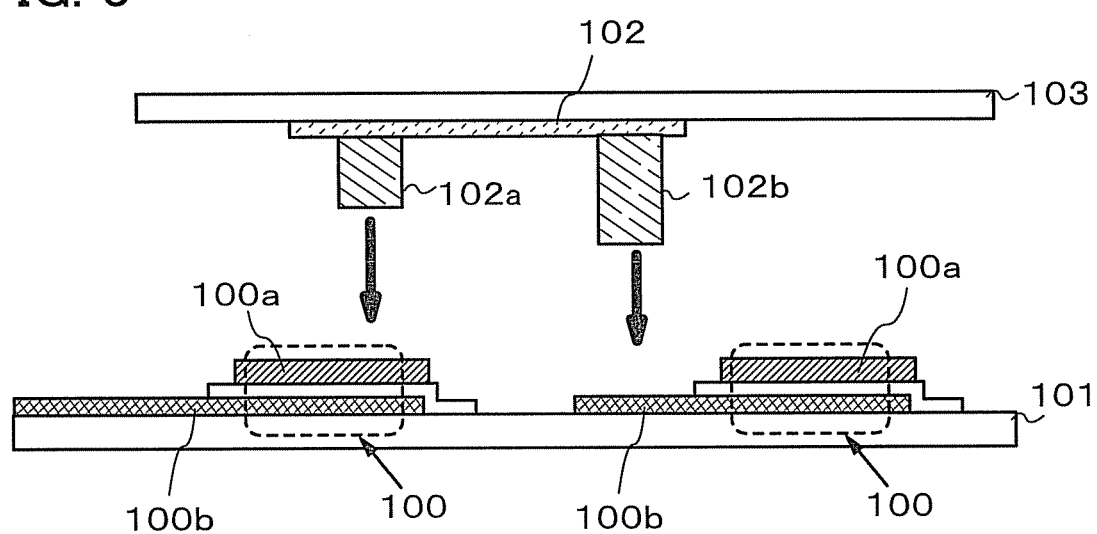
FIG. 3 is a process view illustrating a connection structure included in a lighting device.

A method for providing the plugs and the connection wiring for the second substrate (counter substrate), which is different from that in FIGS. 2A to 2C will be described. FIG. 3 shows an example in which the second substrate 103 on which the connection wiring 102 and the plugs 102a and 102b are formed is bonded to the first substrate (element substrate) 101. The plugs 102a and 102b can have different heights. The heights of the plugs 102a and 102b are determined by the distance between the second substrate 103 and the upper electrode 100a and the distance between the second substrate 103 and the lower electrode 100b, respectively. The plugs 102a and 102b are distorted in shape after the attachment.

The plugs 102a and 102b may have the same heights. In that case, the plugs have elasticity so that the plugs are transformed in accordance with the heights of structures formed over the first substrate, which are in contact with the plugs after the attachment, and eliminate differences between the heights.

The structure of the other components can be referred to as the above embodiments.

In this manner, the connection structure is formed. After that, the substrates are bonded to each other and the electrical connection is formed.

(Embodiment 4)

In this embodiment, one embodiment of a connection structure of plugs and a connection wiring, which is included in a lighting device of the present invention, will be described.

Figure 4A:
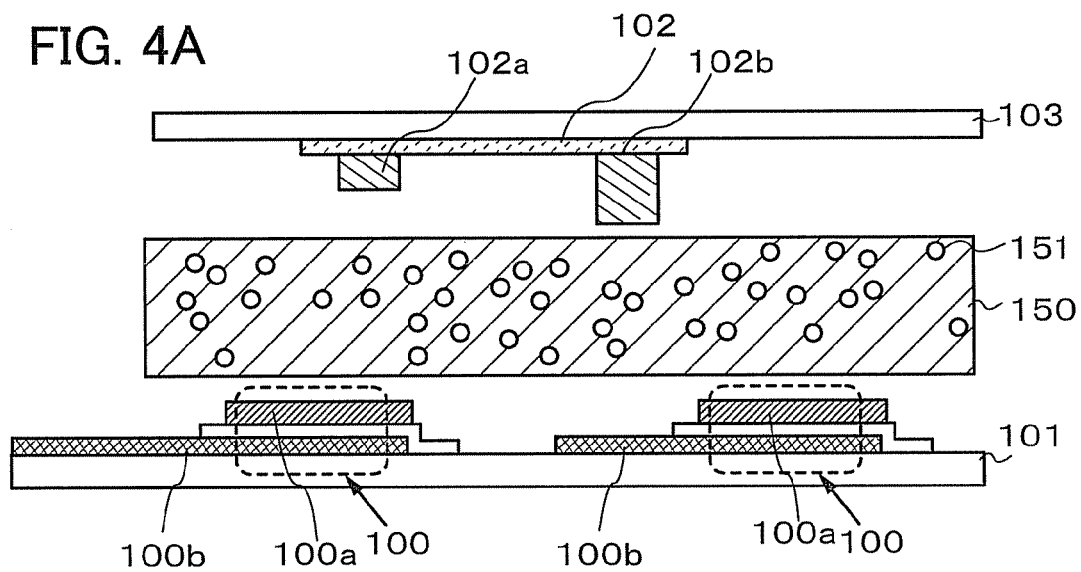
FIGS. 4A and 4B are process views illustrating a connection structure included in a lighting device.

As illustrated in FIG. 4A, an anisotropic conductive film 150 is used in addition to the connection structure of the plugs and the connection wiring. The first substrate (element substrate) 101 and the second substrate (counter substrate) 103 are bonded with the anisotropic conductive film 150 provided therebetween. The anisotropic conductive film 150 is formed of a binder resin containing conductive particles 151 which are formed of spherical resins plated with a metal such as gold. The binder resin may have an adhesion property.

Figure 4B:
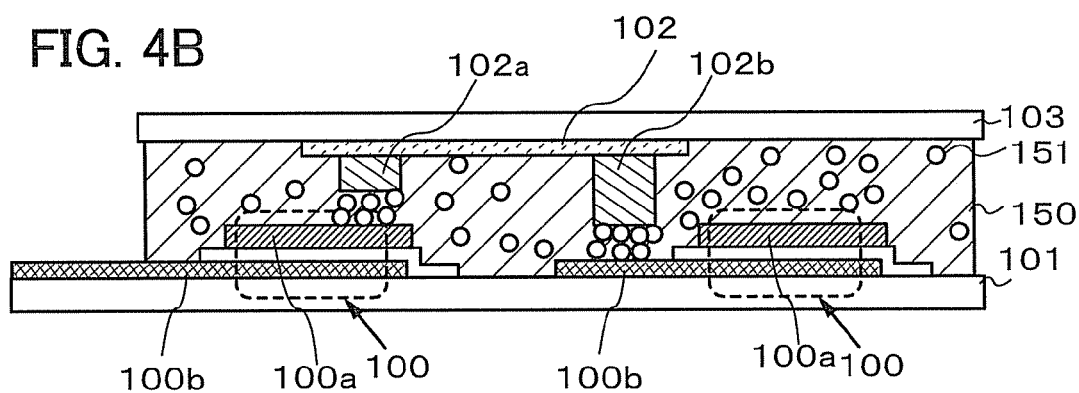

As illustrated in FIG. 4B, the plugs 102a and 102b and the connection wiring 102 are electrically connected to the upper electrode 100a and the lower electrode 100b through the anisotropic conductive film 150 in the bonding process. The anisotropic conductive film 150 provides electrical continuity only in the vertical direction; that is, electrical continuity is provided only between the plug 102a and the upper electrode 100a, and the plug 102b and the lower electrode 100b by the conductive particles 151 in the anisotropic conductive film 150.

Pressure applied to the anisotropic conductive film 150 is preferably uniform. The plug 102b on the connection wiring is preferably formed so as to be higher than the plug 102a.

The anisotropic conductive film 150 may have a function of a desiccant. The anisotropic conductive film containing an absorbent material for absorbing moisture or the like in the anisotropic conductive film can prevent from degradation of the light-emitting element due to moisture.

The structure of the other components can be referred to as the above embodiments.

In such a manner, the connection structure is formed and the electrical connection can be formed. The bottom emission structure in which the light emitted from the light-emitting element is extracted from the first substrate side is preferably used.

(Embodiment 5)

In this embodiment, one embodiment of a connection structure of plugs and a connection wiring, which is included in a lighting device of the present invention, will be described.

Figure 5A:
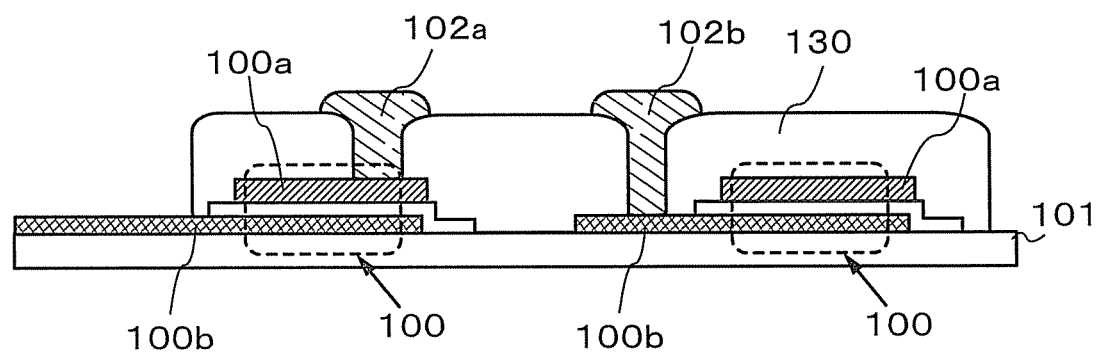
FIGS. 5A and 5B are process views illustrating a connection structure included in a lighting device.

As illustrated in FIG. 5A, an insulating layer 130 is formed so as to cover some parts of the light-emitting element 100. The insulating layer 130 contains an inorganic material or an organic material. The insulating layer 130 may have a stacked-layer structure of an inorganic material and an organic material. When silicon oxynitride, silicon nitride oxide, silicon nitride, or the like is used as the inorganic material, moisture from the organic material which is stacked over the inorganic material can be prevented from entering the light-emitting element. The organic material may contain a moisture absorbent. The insulating layer 130 can protect the light-emitting element from static electricity which may be generated in the manufacturing process. Further, the insulating layer 130 can protect the light-emitting element from a physical damage which may occur in the manufacturing process.

The insulating layer 130 has openings through which the upper electrode 100a and the lower electrode 100b are partially exposed. The plugs 102a and 102b are formed in the openings. A diameter of the opening in which the plug 102a is formed is preferably larger than that of the opening in which the plug 102b is formed. A material and a method for forming each of the plugs 102a and 102b are similar to those in the above embodiments.

Figure 5B:
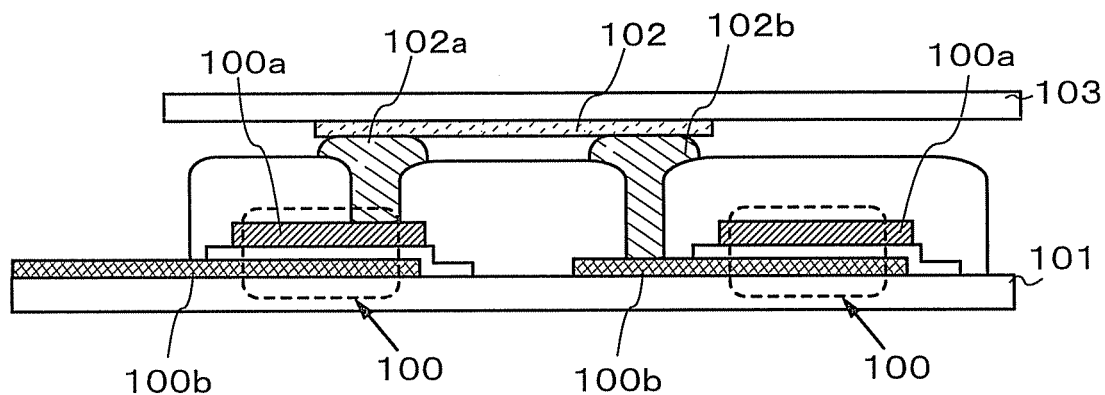

Then, as illustrated in FIG. 5B, the second substrate (counter substrate) 103 on which the connection wiring 102 is formed is bonded to the first substrate. Since the plug is formed in the opening of the insulating layer 130, the mechanical strength of the plug as a structure is increased; thus, higher pressure can be applied to the substrate during the bonding process. In other words, a wide set margin of pressure is provided and thus, a large degree of freedom of the manufacturing process can be provided. Further, the connection wiring 102 is electrically connected certainly to the upper electrode 100a and the lower electrode 100b, that is, to the light-emitting elements, and reliability is improved.

The structure of the other components can be referred to as the above embodiments.

In such a manner, the connection structure is formed and the electrical connection can be formed. The bottom emission structure in which the light emitted from the light-emitting element is extracted from the first substrate side is preferably used.

(Embodiment 6)

In this embodiment, one embodiment of a connection structure of plugs and a connection wiring, which is included in the lighting device of the present invention, will be described.

Figure 6A:
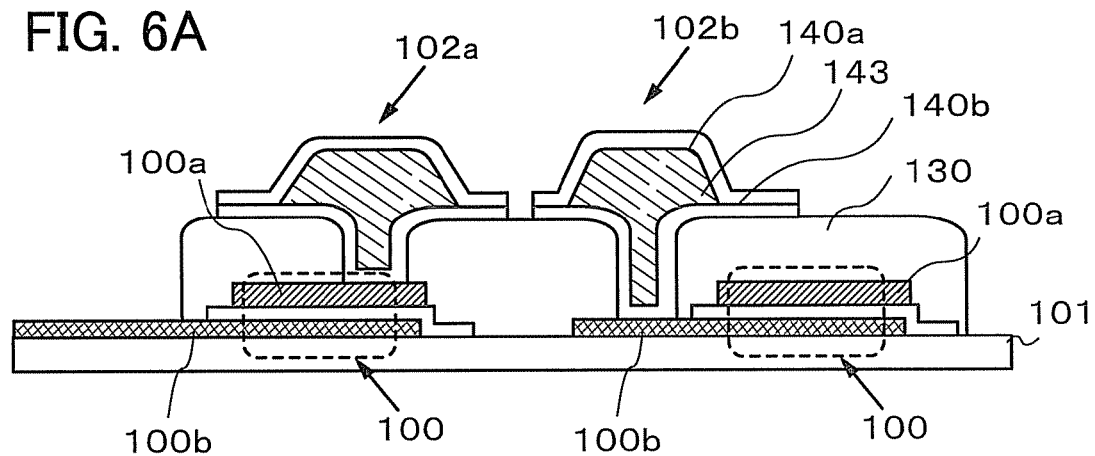
FIGS. 6A and 6B are process views illustrating a connection structure included in a lighting device.

As illustrated in FIG. 6A, each of the plugs 102a and 102b of the connection wiring have a stacked-layer structure in the opening of the insulating layer 130 covering some parts of the light-emitting element. In the stacked-layer structure, an insulating layer 143 is provided between conductive layers 140a and 140b. The insulating layer 143 can control the heights of the plugs 102a and 102b. The conductive layers 140a and 140b are electrically connected to each other outside the insulating layer 143. Each of the conductive layers 140a and 140b can be formed by a sputtering method. When the plug has a stacked-layered structure, each of the conductive layers 140a and 140b may be formed to be thin. Further, each of the conductive layers 140a and 140b can be a single-layer formed using a material selected from aluminum, gold, silver, copper, titanium, tungsten, molybdenum, chromium, and the like, an alloy layer of the above material, or a stacked-layer of the above materials. The insulating layer 143 contains an organic material or an inorganic material. With an organic material, the insulating layer 143 can be formed to be thick. Although an organic material contains moisture in some cases, the moisture can be prevented from entering the light-emitting element because the insulating layer 143 is provided between the conductive layers 140a and 140b.

Figure 6B:
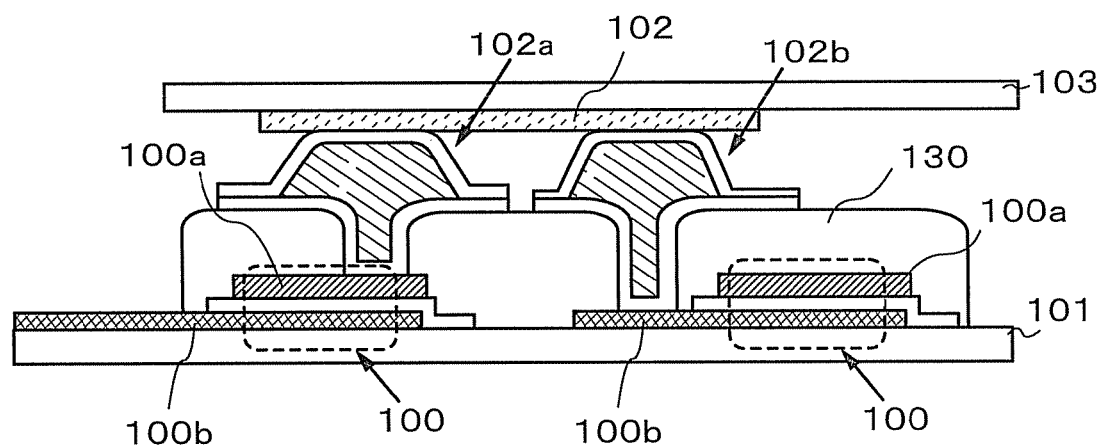

Then, as illustrated in FIG. 6B, the second substrate (counter substrate) 103 on which the connection wiring 102 is formed is bonded to the first substrate. Since the plugs 102a and 102b formed in the openings of the insulating layer 130 each have a stacked-layer structure, the mechanical strength of the plug as a structure is increased; thus, higher pressure can be applied to the substrate during the bonding process. In other words, a wide set margin of pressure is provided and thus, a large degree of freedom of the manufacturing process can be provided. Further, the connection wiring 102 is electrically connected to the upper electrode 100a and the lower electrode 100b, that is, to the light-emitting elements certainly and reliability is improved.

The structure of the other components can be referred to as the above embodiments.

In such a manner, the connection structure is formed and the electrical connection can be formed. The bottom emission structure in which the light emitted from the light-emitting element is extracted from the first substrate side is preferably used.

(Embodiment 7)

In this embodiment, one embodiment of a lighting device of the present invention will be described.

Figure 7:
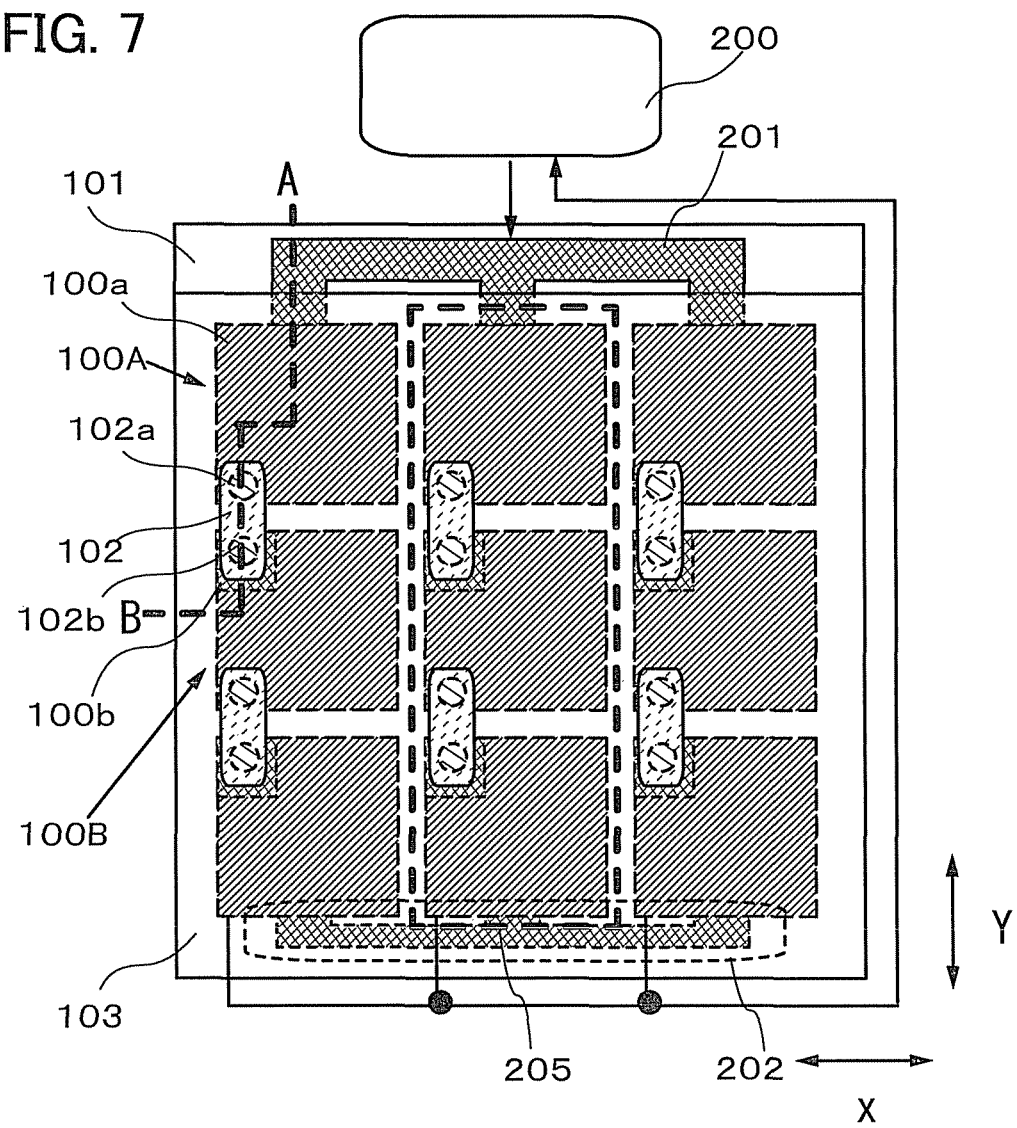
FIG. 7 is a top view illustrating a lighting device.

FIG. 7 is a top view of the lighting device. A dotted line A-B in FIG. 7 corresponds to A-B of the cross-sectional view of the lighting device described in the above embodiment with reference to FIG. 1. The plurality of light-emitting elements 100 is arranged in an X direction and a Y direction. In other words, the plurality of light-emitting elements 100 is arranged in matrix. The light-emitting element 100 is rectangular. When the plurality of light-emitting elements is arranged in matrix, the degree of integration can be increased. The upper electrode 100a of a light-emitting element and the lower electrode 100b of another light-emitting element are electrically connected to each other through the connection wiring 102 so that the plurality of light-emitting elements is electrically connected to each other. In the case where adjacent light-emitting elements 100A and 100B are electrically connected to each other, as illustrated in FIG. 7, the upper electrode 100a of the light-emitting element 100A is electrically connected to, the lower electrode 100b of the light-emitting element 100B through the connection wiring 102. In a group (light-emitting element group) 205 of the plurality of light-emitting elements 100, the light-emitting elements are electrically connected to each other in series through the connection wirings 102. The plurality of connection wirings 102 is arranged linearly in the Y direction.

One end of each of the lower electrodes 100b of the light-emitting elements 100 which are arranged on a power supply circuit side reaches the end of the first substrate 101. The lower electrodes 100b are preferably converged at the end of the first substrate 101. A region where the lower electrodes 100b are converged can be a connection portion 201 where the electrical connection with a circuit (power supply circuit) 200 for supplying power is formed. In the case where the lower electrodes are anodes, the lower electrodes are electrically connected to a high potential side of the power supply circuit 200 through the connection portion 201. In such a manner, when the electrical connection is formed through the connection portion 201, the first substrate 101 has a larger area than the second substrate 103. Further, the other end of each of the lower electrodes 100b of the light-emitting elements 100 which are arranged on the side opposite to the power supply circuit can be converged in a region 202 which is opposite to the power supply circuit 200. The lower electrodes 100b can also be electrically connected to the power supply circuit 200 through the other end of each of the lower electrodes 100b of the light-emitting elements 100 which are arranged on the side opposite to the power supply circuit. In that case, a voltage drop in the lower electrode can be prevented.

The power supply circuit 200 may be provided on the second substrate 103 side. When a single crystal semiconductor substrate is used as the second substrate 103, the power supply circuit 200 can be formed on the substrate.

The upper electrodes 100a of the light-emitting elements 100 can be converged with the use of the plugs 102a and 102b or the connection wiring 102. When the connection wiring 102 is used, the upper electrodes 100a may be converged on the second substrate 103 side. In the case where the upper electrodes are cathodes, the upper electrodes are electrically connected to the low potential side of the power supply circuit 200 through the region where the upper electrodes are converged. The upper electrodes 100a may be electrically connected to a low potential side of the power supply circuit 200 without convergence. As in the case of the lower electrode, the electrical connection with the power supply circuit 200 may be formed in a plurality of regions as long as a voltage drop can be prevented.

As the power supply circuit 200, a voltage supply circuit which supplies constant voltage or a current source circuit which supplies constant current can be given.

As shown in FIG. 7, the connection wiring 102 overlaps with only part of the light-emitting element 100. Thus, the light emitted from the light-emitting element can be utilized to maximum. As a result, emission efficiency can be enhanced.

(Embodiment 8)

In this embodiment, one embodiment of a lighting device of the present invention will be described.

Figure 8:
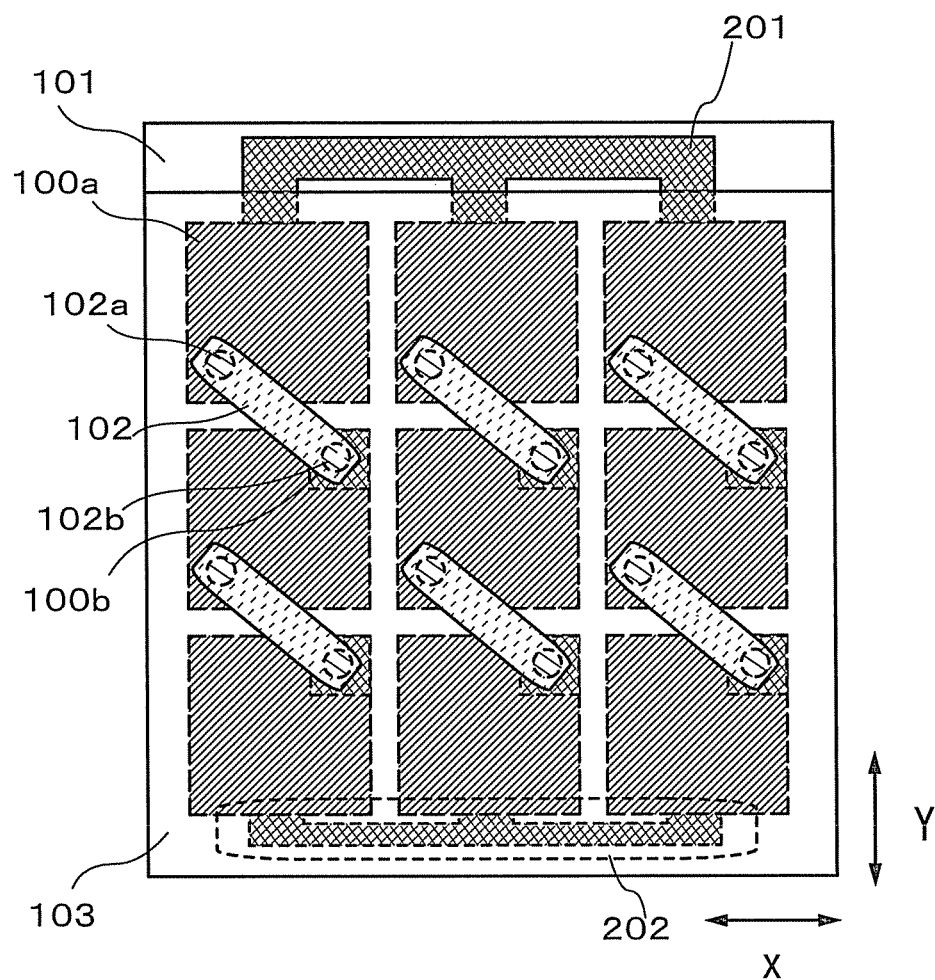
FIG. 8 is a top view illustrating a lighting device.

FIG. 8 is a top view of the lighting device. Unlike in the top view in FIG. 7, the connection wiring 102 is arranged obliquely. The connection wiring 102 is longer than that in FIG. 7. Since the plugs 102a and 102b are located diagonally to each other, the distance between the plugs 102a and 102b is longer than that in FIG. 7. When the distance between the plugs 102a and 102b is long, the plugs 102a and 102b are easily formed.

As shown in FIG. 8, the connection wiring 102 overlaps with only part of the light-emitting element 100. Thus, the light emitted from the light-emitting element can be utilized to maximum. As a result, emission efficiency can be enhanced.

Further, as in the case of FIG. 7, the lower electrode 100b is electrically connected to the power supply circuit 200 through the connection portion 201. Similarly, the upper electrode 100a is electrically connected to the power supply circuit 200 (not illustrated).

(Embodiment 9)

In this embodiment, one embodiment of a lighting device of the present invention will be described.

Figure 9:
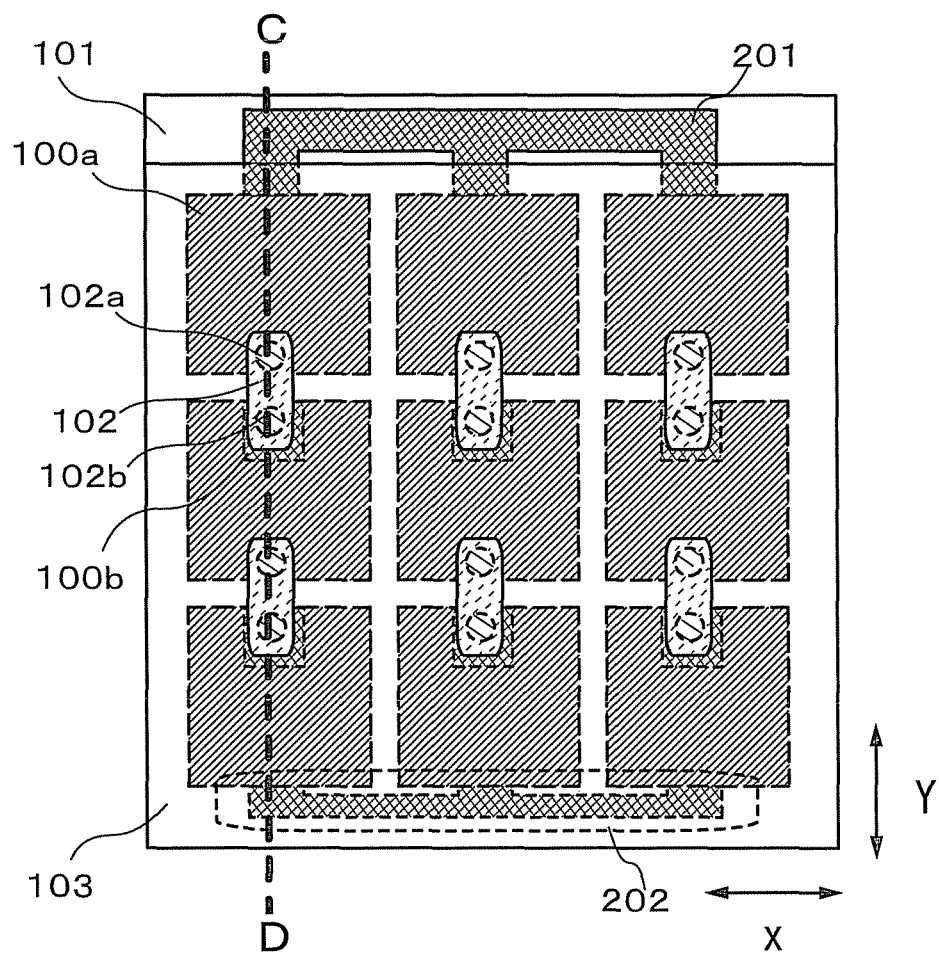
FIG. 9 is a top view illustrating a lighting device.

FIG. 9 is a top view of the lighting device. The plurality of connection wirings 102 is arranged linearly in the Y direction. Unlike in the top view in FIG. 7, the connection wirings 102 are arranged in a straight line which passes through the centers of the light-emitting elements. In the Y direction, the connection wiring 102 and a branching region of the connection portion 201 are arranged in the same straight line. When attention is focused on a dotted line C-D, the connection portion 201 is electrically connected to at least a plurality of light-emitting elements. According to the above, the connection wiring 102 and the branching region of the connection portion 201 are arranged in the same straight line. Further, in the Y direction, the connection wiring 102 and a branching region of the region 202 where the lower electrodes are electrically connected to each other are arranged in the same straight line. When attention is focused on a dotted line C-D, the region 202 is electrically connected to at least the plurality of light-emitting elements; thus, the connection wiring 102 and the branching region of the region 202 are arranged in the same straight line.

With such arrangement of the connection wirings 102, a variation in luminance of the plurality of light-emitting elements can be suppressed. When the upper electrode 100a or the lower electrode 100b is thin and an area thereof is large, a voltage drop might occur. With the above arrangement of the connection wirings 102, adverse effect of the voltage drop due to the upper electrode 100a or the lower electrode 100b can be reduced.

As shown in FIG. 9, the connection wiring 102 overlaps with only part of the light-emitting element 100. Thus, the light emitted from the light-emitting element can be utilized to maximum. As a result, emission efficiency can be enhanced.

Further, as in the case of FIG. 7, the lower electrode 100b is electrically connected to the power supply circuit 200 through the connection portion 201. Similarly, the upper electrode 100a is electrically connected to the power supply circuit 200 (not illustrated).

(Embodiment 10)

In this embodiment, one embodiment of a lighting device of the present invention will be described.

Figure 10:
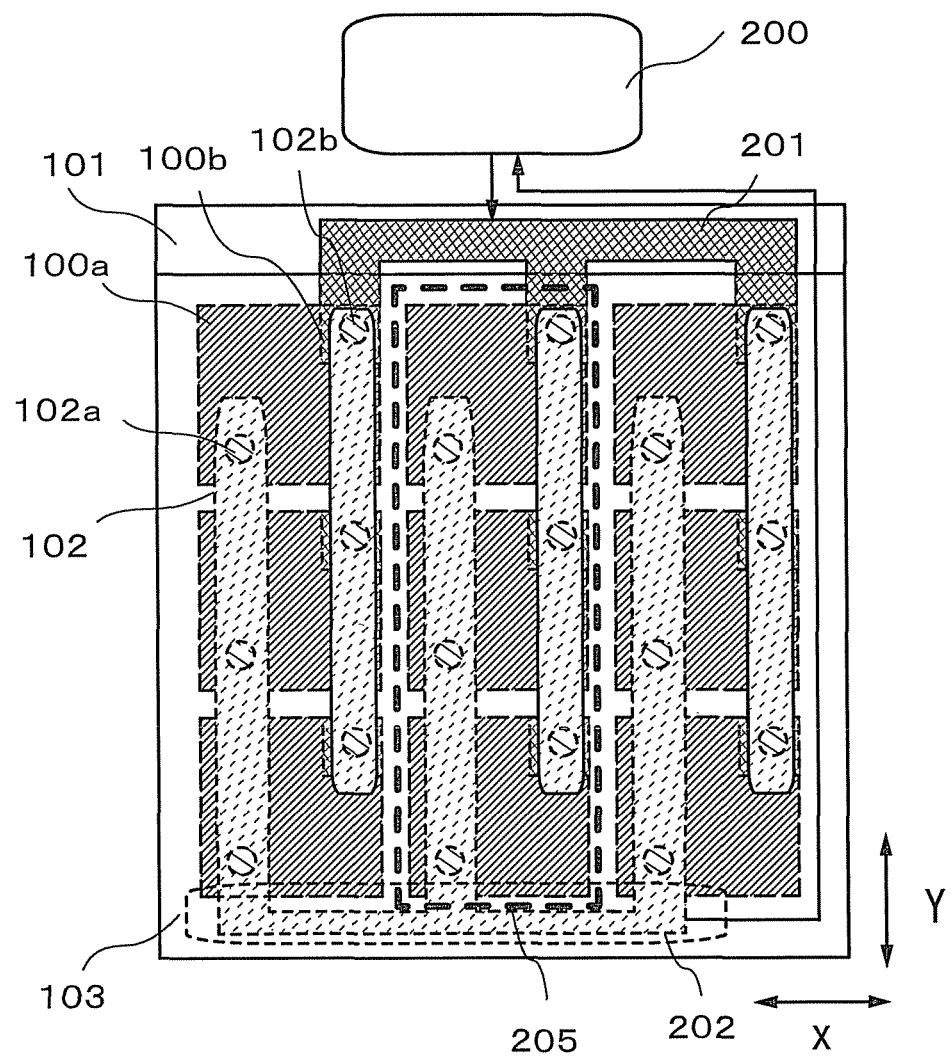
FIG. 10 is a top view illustrating a lighting device.

FIG. 10 is a top view of the lighting device. Although the arrangements of the plurality of light-emitting elements 100, the upper electrodes 100a, the lower electrodes 100b, and the plugs 102a and 102b on the connection wirings are substantially the same as those in the top view in FIG. 8, the shape of the connection wiring 102 is different.

Through the connection wiring 102, the upper electrodes 100a of the plurality of light-emitting elements are electrically connected to each other and the lower electrodes 100b of the plurality of light-emitting elements are electrically connected to each other. When attention is focused on the plurality of groups 205 each including the plurality of light-emitting elements 100, the adjacent light-emitting element groups are electrically connected to each other in parallel with the connection wirings 102. In the light-emitting element group 205, the plurality of light-emitting elements is electrically connected to each other in parallel.

Power is supplied from the power supply circuit 200 through the connection portion 201. The upper electrodes are electrically connected to each other through the region 202 on the side opposite to the power supply circuit 200. That is, the upper electrodes are converged in the region 202.

By changing the arrangement of the connection wirings 102 formed on the second substrate 103, electrical connection relation of the light-emitting elements can be freely changed.

As shown in FIG. 10, even when the light-emitting elements are electrically connected to each other in parallel, the connection wiring 102 overlaps with only part of the light-emitting element 100. Thus, the light emitted from the light-emitting element can be utilized to maximum. As a result, emission efficiency can be enhanced.

Further, as in the case of FIG. 7, the lower electrode 100b is electrically connected to the power supply circuit 200 through the connection portion 201. Similarly, the upper electrode 100a is electrically connected to the power supply circuit 200 through the region 202 where the upper electrodes 100a are converged.

(Embodiment 11)

In this embodiment, one embodiment of a lighting device of the present invention will be described.

Figure 11:
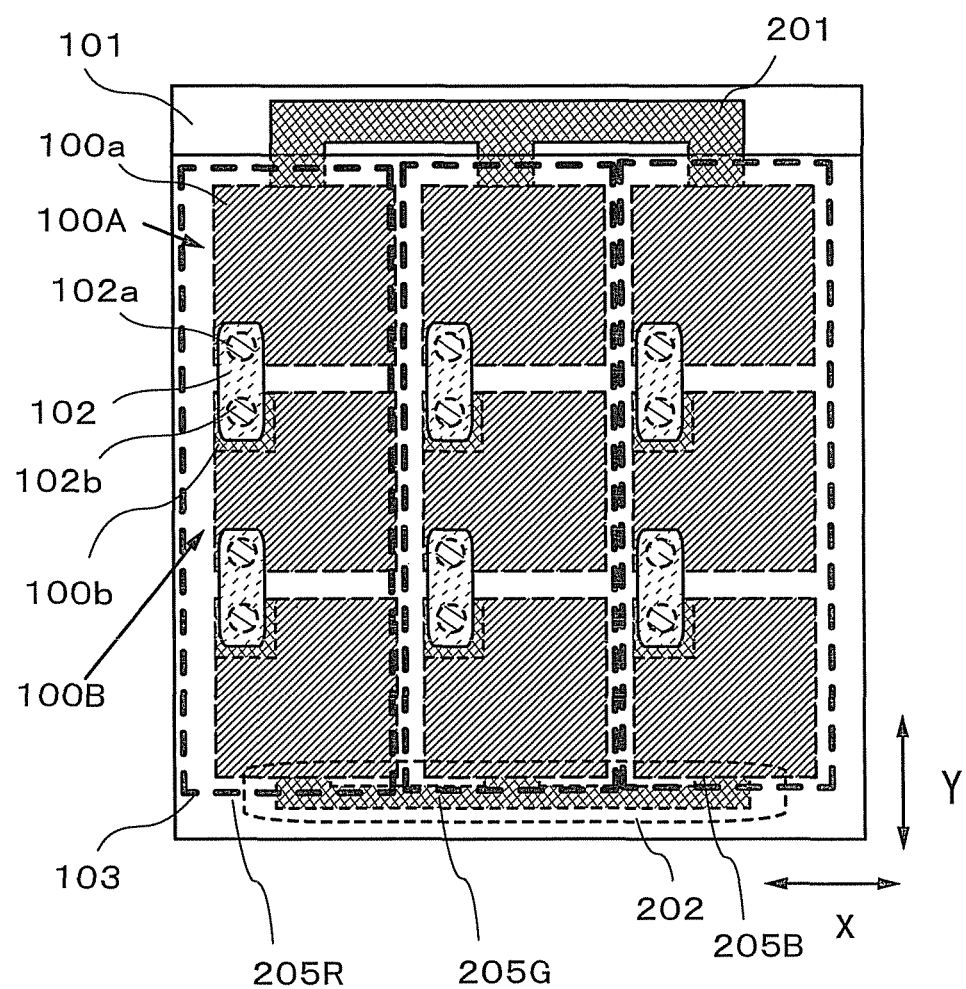
FIG. 11 is a top view illustrating a lighting device.

FIG. 11 is a top view of the lighting device. As in the case of FIG. 7, the plurality of light-emitting elements 100 is electrically connected to each other in series. Light-emitting element groups 205R, 205G, and 205B in which the plurality of light-emitting elements are electrically connected to each other in series can be formed using their respective materials. The light-emitting element group 205R includes red light-emitting elements, the light-emitting element group 205G includes green light-emitting elements, and the light-emitting element group 205B includes blue light-emitting elements.

When materials of the light-emitting elements are different between the groups, the range of emission color can be expanded.

Further, as in the case of FIG. 7, the lower electrode 100b is electrically connected to the power supply circuit 200 through the connection portion 201. Similarly, the upper electrode 100a is electrically connected to the power supply circuit 200 (not illustrated).

(Embodiment 12)

In this embodiment, one embodiment of a lighting device of the present invention will be described.

Figure 12:
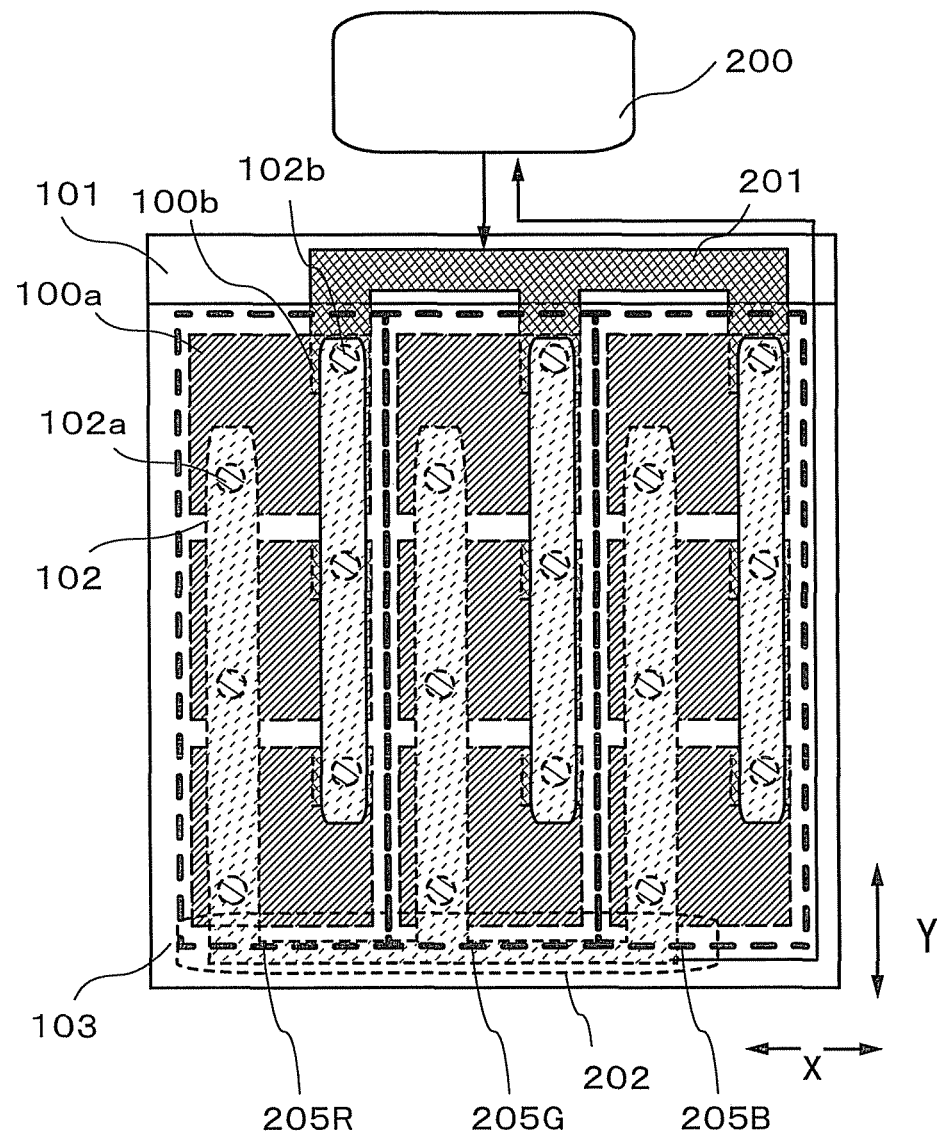
FIG. 12 is a top view illustrating a lighting device.

FIG. 12 is a top view of the lighting device. As in the case of FIG. 10, the plurality of light-emitting elements 100 is electrically connected to each other in parallel. The light-emitting element groups 205R, 205G, and 205B in which the plurality of light-emitting elements are electrically connected to each other in parallel can be formed using their respective materials. The light-emitting element group 205R includes red light-emitting elements, the light-emitting element group 205G includes green light-emitting elements, and the light-emitting element group 205B includes blue light-emitting elements.

When materials of the light-emitting elements are different between the groups, the range of emission color can be expanded.

Further, as in the case of FIG. 7, the lower electrode 100b is electrically connected to the power supply circuit 200 through the connection portion 201. Similarly, the upper electrode 100a is electrically connected to the power supply circuit 200 through the region 202 where the upper electrodes 100a are converged.

(Embodiment 13)

In this embodiment, one embodiment of a lighting device of the present invention will be described.

Figure 13:
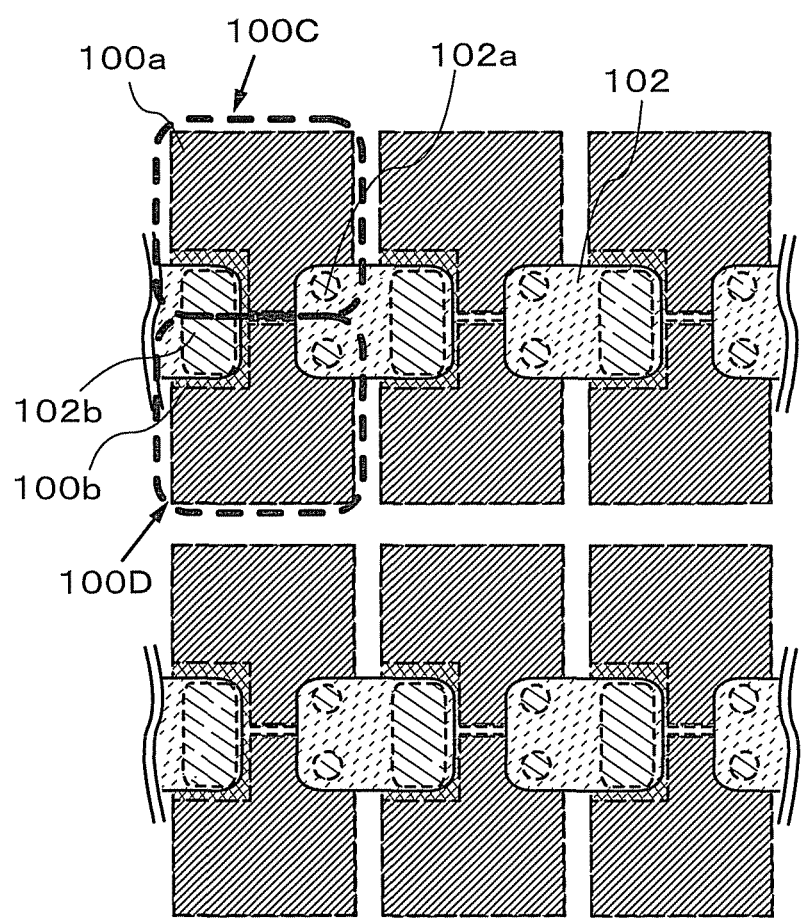
FIG. 13 is a top view illustrating a lighting device.

FIG. 13 is a top view showing part of the lighting device. The plug 102b is shared by adjacent light-emitting elements. Description is made with the use of adjacent light-emitting elements 100C and 100D. The light-emitting elements 100C and 100D each include the upper electrode 100a and the lower electrode 100b. The plug 102b provided over the lower electrode is shared by the light-emitting elements 100C and 100D on the connection wiring 102. The plug 102a provided over the upper electrode is included in each light-emitting element.

The lower electrodes of the light-emitting elements 100C and 100D have the same potential. Accordingly, the lower electrodes of the light-emitting elements 100C and 100D may be formed using the same film without being divided by etching or the like.

When the plug 102b is shared by the adjacent light-emitting elements 100C and 100D, the distance therebetween can be decreased. Thus, the plurality of light-emitting elements can be highly integrated.

In this structure, the plurality of light-emitting elements can be electrically connected to each other in series through the connection wiring 102.

(Embodiment 14)

In this embodiment, one embodiment of a lighting device of the present invention will be described.

Figure 14:
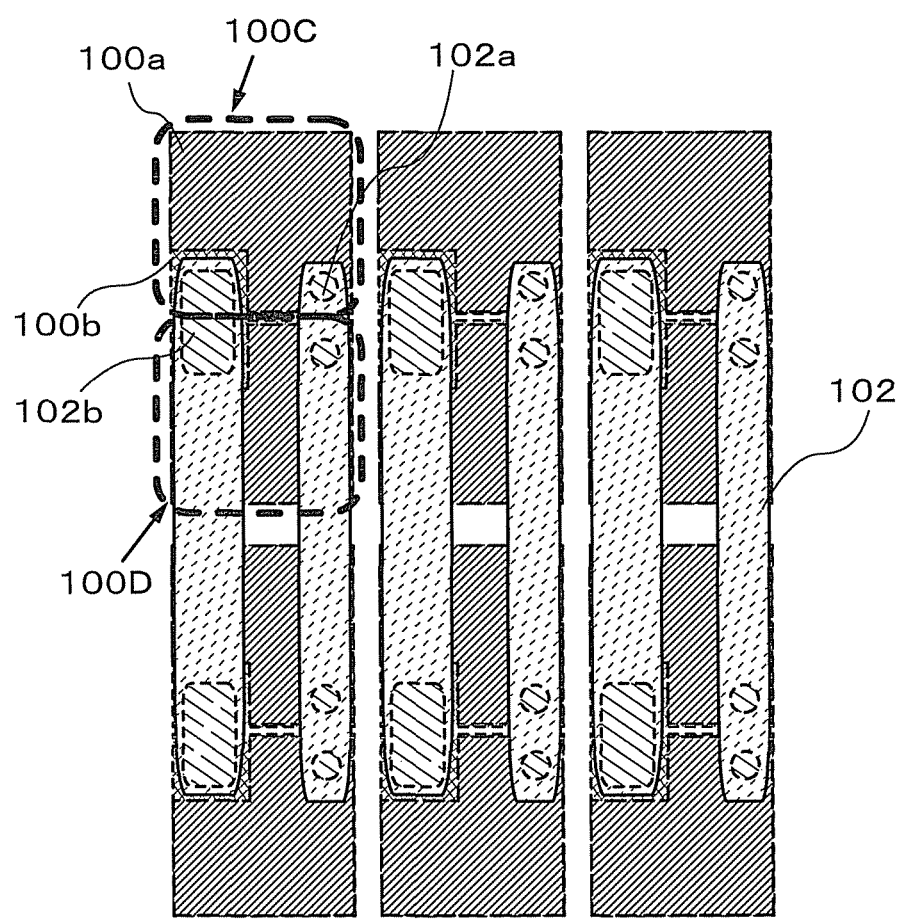
FIG. 14 is a top view illustrating a lighting device.

FIG. 14 is a top view showing part of the lighting device in which the connection wirings 102 are arranged in a manner different from that in FIG. 13. In the lighting device illustrated in FIG. 14, the plurality of light-emitting elements is electrically connected to each other in parallel through the connection wiring 102.

As in the case of the lighting device illustrated in FIG. 13, the plug 102b on the connection wiring 102 is shared by adjacent light-emitting elements. Description is made with the use of adjacent light-emitting elements 100C and 100D. The light-emitting elements 100C and 100D each include the upper electrode 100a and the lower electrode 100b. The plug 102b provided over the lower electrode is shared by the light-emitting elements 100C and 100D on the connection wiring 102. The plug 102a provided over the upper electrode is included in each light-emitting element.

The lower electrodes of the light-emitting elements 100C and 100D have the same potential. Accordingly, the lower electrodes of the light-emitting elements 100C and 100D may be formed using the same film without being divided by etching or the like.

When the plug 102b is shared by the adjacent light-emitting elements 100C and 100D, the distance therebetween can be decreased. Thus, the plurality of light-emitting elements can be highly integrated.

In accordance with the arrangement of the connection wirings 102, the electrical connection between the plurality of light-emitting elements can be determined.

The light-emitting elements in the lighting device illustrated in FIG. 14 are connected to each other in parallel while the light-emitting elements in the lighting device illustrated in FIG. 13 are connected to each other in series.

(Embodiment 15)

In this embodiment, one embodiment of a lighting device of the present invention will be described.

Figure 15:
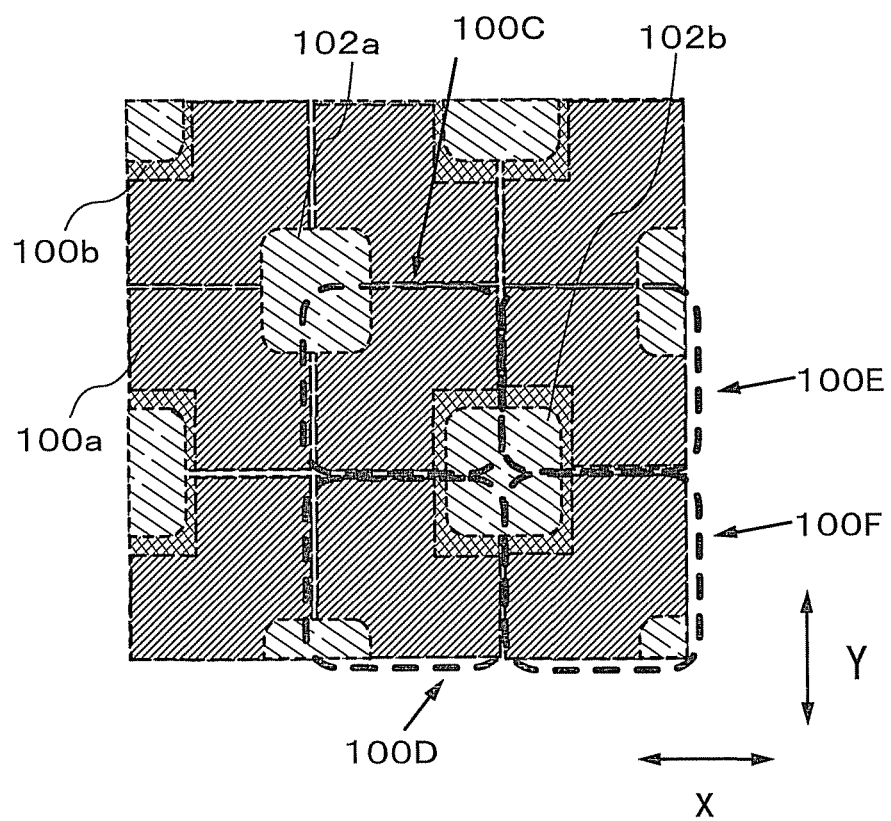
FIG. 15 is a top view illustrating a lighting device.

FIG. 15 is a top view showing part of the lighting device in which the plugs 102a and 102b are arranged in manners different from those in FIG. 13 and FIG. 14. In the lighting device illustrated in FIG. 15, the plug 102b is shared by four light-emitting elements adjacent in the X direction and the Y direction. Description is made with four adjacent light-emitting elements 100C, 100D, 100E, and 100F. The light-emitting elements 100C, 100D, 100E, and 100F each include the upper electrode 100a and the lower electrode 100b. The plug 102b provided over the lower electrode is shared by the light-emitting elements 100C, 100D, 100E, and 100F on the connection wiring.

In the plurality of light-emitting elements 100C, 100D, 100E, and 100F, the lower electrodes have the same potential through the shared plug 102b. Accordingly, the lower electrodes of the light-emitting elements 100C, 100D, 100E, and 100F may be formed using the same film without being divided by etching or the like.

When attention is focused on the shared plug 102a, similarly to the plug 102b, the upper electrodes of four adjacent light-emitting elements by which the plug 102a is shared have the same potential through the shared plug 102a. Accordingly, the upper electrodes of the above four adjacent light-emitting elements may be formed using the same film without being divided by etching or the like.

When the plug 102b is shared by the adjacent light-emitting elements 100C, 100D, 100E, and 100F, the distances between the adjacent light-emitting elements can be decreased. Thus, the plurality of light-emitting elements can be highly integrated.

Figure 16:
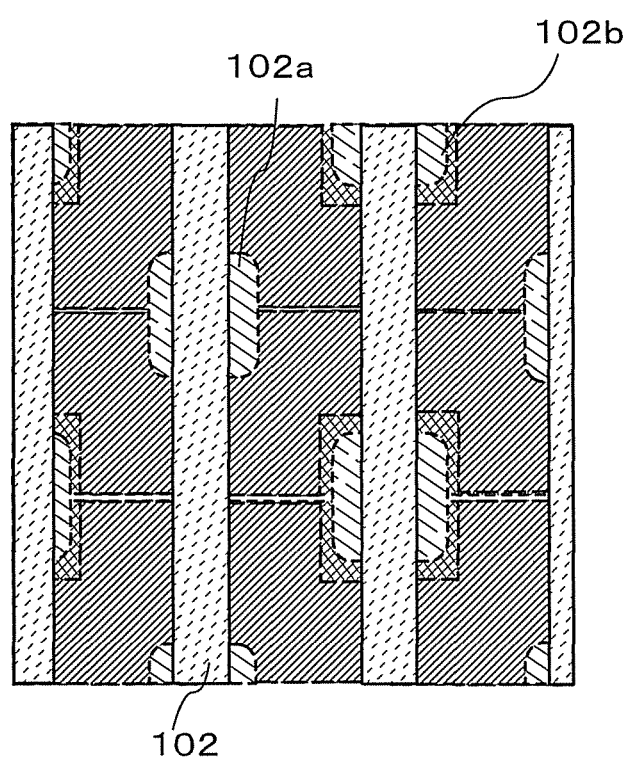
FIG. 16 is a top view illustrating a lighting device.

In the lighting device illustrated in FIG. 15, the electrical connection between the plurality of light-emitting elements is determined by the arrangement of the connection wirings 102. When the connection wirings 102 are arranged so that the plugs 102a are electrically connected to each other and the plugs 102b are electrically connected to each other as illustrated in FIG. 16, the plurality of light-emitting elements is connected to each other in parallel.

(Embodiment 16)

In this embodiment, one embodiment of a lighting device of the present invention will be described.

Figure 17A:
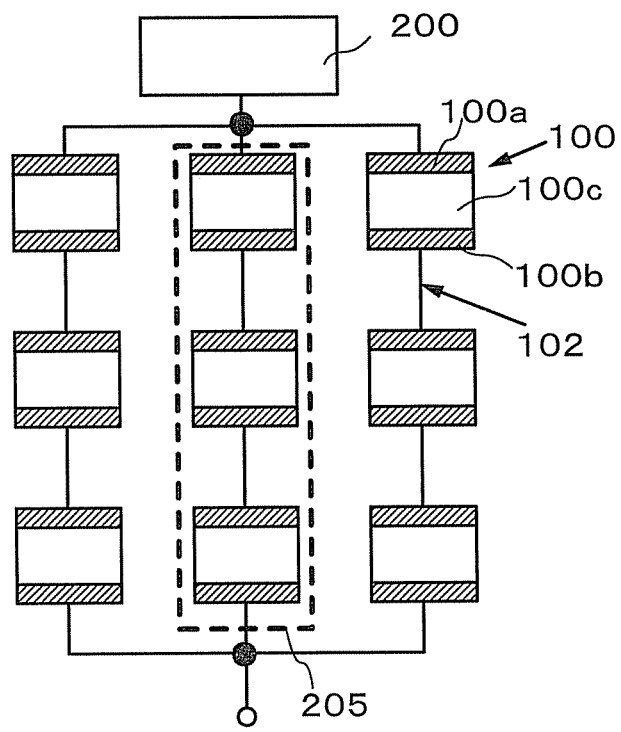
FIGS. 17A and 17B are circuit diagrams illustrating a lighting device.

FIG. 17A is a circuit diagram illustrating electrical connection relations of the plurality of light-emitting elements in the lighting device.

The light-emitting element 100 includes the upper electrode 100a, the lower electrode 100b, and the organic compound layer 100c provided therebetween. Power is supplied from the power supply circuit 200. The electrode of each light-emitting element, which is on the power supply circuit 200 side, has a high potential. The plurality of light-emitting elements is electrically connected to each other in series through the connection wiring 102. Those light-emitting elements form the light-emitting element group 205. There are two or more light-emitting elements which are electrically connected to each other in series in the light-emitting element group 205. FIG. 17A shows an example where three light-emitting elements are electrically connected to each other.

The light-emitting element groups 205 are electrically connected to each other in parallel. There are two or more light-emitting element groups which are electrically connected to each other in parallel. FIG. 17A shows an example where three light-emitting element groups are electrically connected to each other.

In such a manner, the light-emitting elements can be electrically connected to each other through the connection wiring 102 and the plugs 102a and 102b. Then, power is supplied from the power supply circuit 200 and light is emitted from the light-emitting element.

The electrical connection between the plurality of light-emitting elements can be freely determined by the arrangement of the connection wirings 102. As illustrated in FIG. 17A, the plurality of light-emitting elements can be electrically connected to each other in series.

The lighting device in which the plurality of light-emitting elements is electrically connected to each other in series has the structure described in the above embodiments. For example, a structure in which the plurality of light-emitting elements is electrically connected to each other in series as illustrated in FIG. 7, FIG. 8, FIG. 9, or the like can be employed.

Figure 17B:
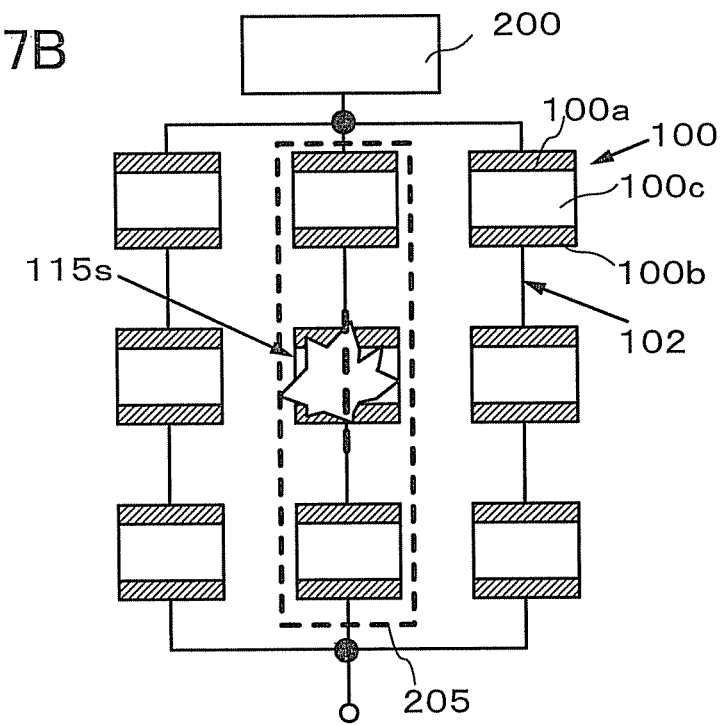

It is assumed that a defect 115s is generated in any one of the light-emitting elements in the lighting device having such a circuit structure, as illustrated in FIG. 17B. For example, in the light-emitting element, a short circuit between the upper electrode 100a and the lower electrode 100b may form an electrical pathway as shown by a dashed line. Even when such a defect is generated, the lighting device can be operated without a heavy burden on the other light-emitting elements because the plurality of light-emitting elements is electrically connected to each other in the light-emitting element group 205.

The light-emitting element with the defect 115s is in a dark state. At this time, voltage applied or current flowing to the other light-emitting elements is higher than that in the case where the defect is not generated. Accordingly, the other light-emitting elements can emit light with a luminance which compensate for the light-emitting element in a dark state. Unlike a display device, the lighting device includes a diffuser plate or the like for diffusing light; thus, the light-emitting element in a dark state is less likely to be recognized.

Such a defect might be generated owing to a potential defect or degradation with time. Even when such a defect is generated and a short circuit between the electrodes occurs in a light-emitting element, as illustrated in FIG. 17B, the lighting device can be operated without a heavy burden on the other light-emitting elements.

(Embodiment 17)

In this embodiment, one embodiment of a lighting device of the present invention will be described.

FIGS. 18A and 18B are circuit diagrams illustrating electrical connection relations of the plurality of light-emitting elements in the lighting device.

Unlike in FIGS. 17A and 17B, the plurality of light-emitting elements is electrically connected to each other in parallel through the connection wiring 102. The number of the light-emitting elements is preferably two or more. FIG. 18A shows an example where three light-emitting elements are connected to each other.

In such a manner, the light-emitting elements can be electrically connected to each other through the connection wiring 102 and the plugs 102a and 102b. Then, power is supplied from the power supply circuit 200 and light is emitted from the light-emitting element.

The electrical connection between the plurality of light-emitting elements can be freely determined by the arrangement of the connection wirings 102. As illustrated in FIG. 18A, the plurality of light-emitting elements can be electrically connected to each other in parallel.

The lighting device in which the plurality of light-emitting elements is electrically connected to each other in parallel has the structure described in the above embodiments. For example, a structure in which the plurality of light-emitting elements is electrically connected to each other in parallel as illustrated in FIG. 10 or the like can be employed.

It is assumed that the defect 115s is generated in any one of the light-emitting elements in the lighting device having such a circuit structure, as illustrated in FIG. 18B. For example, in the light-emitting element, a short circuit between the upper electrode 100a and the lower electrode 100b may form an electrical pathway as shown by a dashed line. Even when such a defect is generated, the lighting device can be operated without a heavy burden on the other light-emitting elements because the plurality of light-emitting elements is electrically connected to each other in parallel.

The light-emitting element with the defect 115s is in a dark state. Unlike a display device, the lighting device includes a diffuser plate or the like for diffusing light; thus, the light-emitting element in a dark state is less likely to be recognized.

Such a defect might be generated owing to a potential defect or degradation with time. Even when the defect is generated and a short circuit between the electrodes occurs in a light-emitting element, as illustrated in FIG. 18B, the lighting device can be operated without a heavy burden on the other light-emitting elements.

(Embodiment 18)

In this embodiment, one embodiment of a lighting device of the present invention will be described.

Figure 19:
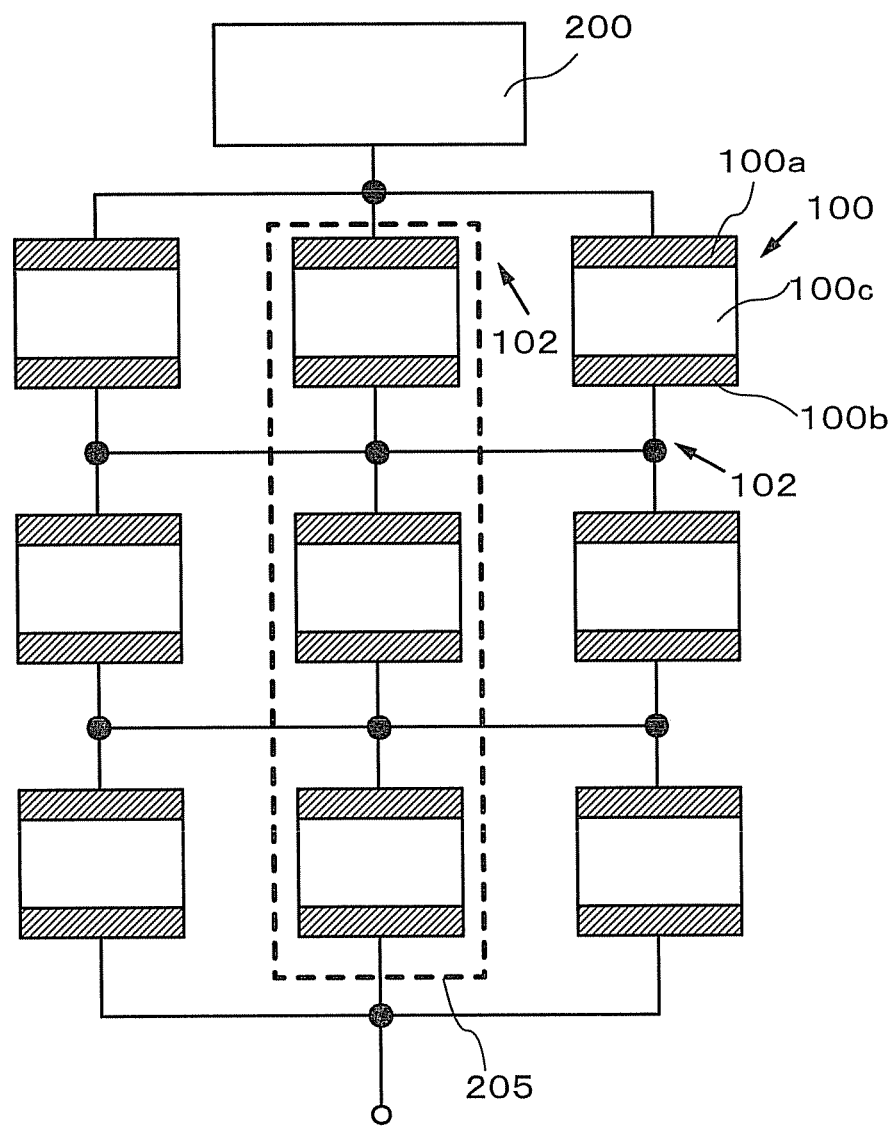
FIG. 19 is a circuit diagram illustrating a lighting device.

FIG. 19 is a circuit diagram illustrating electrical connection relations of the plurality of light-emitting elements in the lighting device.

Unlike in FIGS. 17A and 17B, the plurality of light-emitting elements is electrically connected to each other between the light-emitting element groups 205. In other words, the light-emitting elements which are electrically connected to each other in parallel are included in the light-emitting element groups 205 different from each other. The connection wiring 102 and the plugs 102a and 102b can be used for such electrical connection. Then, power is supplied from the power supply circuit 200 and light is emitted from the light-emitting element.

Even in the case where a defect is generated in the light-emitting element in such a circuit structure, the lighting device can be operated without a heavy burden on the other light-emitting elements.

The lighting device in which the plurality of light-emitting elements is electrically connected to each other in series and in parallel has the structure described in the above embodiments. For example, a structure in which the plurality of light-emitting elements is electrically connected to each other in series and in parallel as illustrated in FIG. 20 or the like can be employed.

Figure 20:
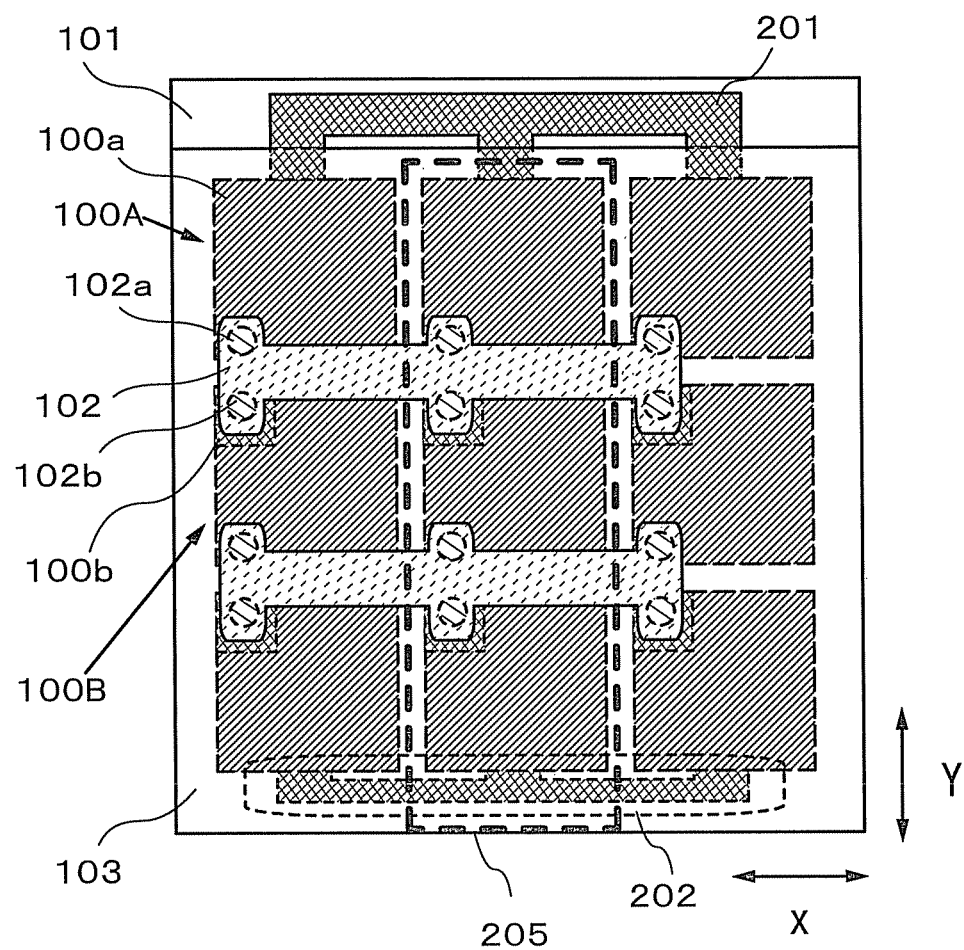
FIG. 20 is a top view illustrating a lighting device.

The connection wiring 102 illustrated in FIG. 20 is different from that in FIG. 7. In FIG. 20, the connection wirings 102 are arranged so that the plurality of light-emitting elements is electrically connected to each other in parallel. The light-emitting elements which are electrically connected to each other in parallel are included in the light-emitting element groups 205 different from each other.

As described above, the electrical connection between the plurality of light-emitting elements can be freely determined by the arrangement of the connection wirings 102.

Further, as in the case of FIG. 7, the lower electrode 100b is electrically connected to the power supply circuit 200 through the connection portion 201. Similarly, the upper electrode 100a is electrically connected to the power supply circuit 200 (not illustrated).

Next, the case where a defect is generated in such a circuit structure will be described with reference to FIGS. 21A and 21B.

Some of the defects block an electrical pathway, so that current does not flow to the light-emitting element. Such defects include a defect due to disconnection of the upper electrode 100a, the lower electrode 100b, the connection wiring 102, the plug 102a or 102b, or the like. Since the upper electrode 100a and the lower electrode 100b are thin, disconnection might occur. The plugs 102a and 102b, and a connection portion between the connection wiring 102 and each of the plugs 102a and 102b may also be disconnected. A connection defect of the connection wiring 102 and the plug 102a or 102b might be generated. For example, the case where a defect 116s is generated in the upper electrode 100a as illustrated in FIGS. 21A and 21B will be described.

Figure 21A:
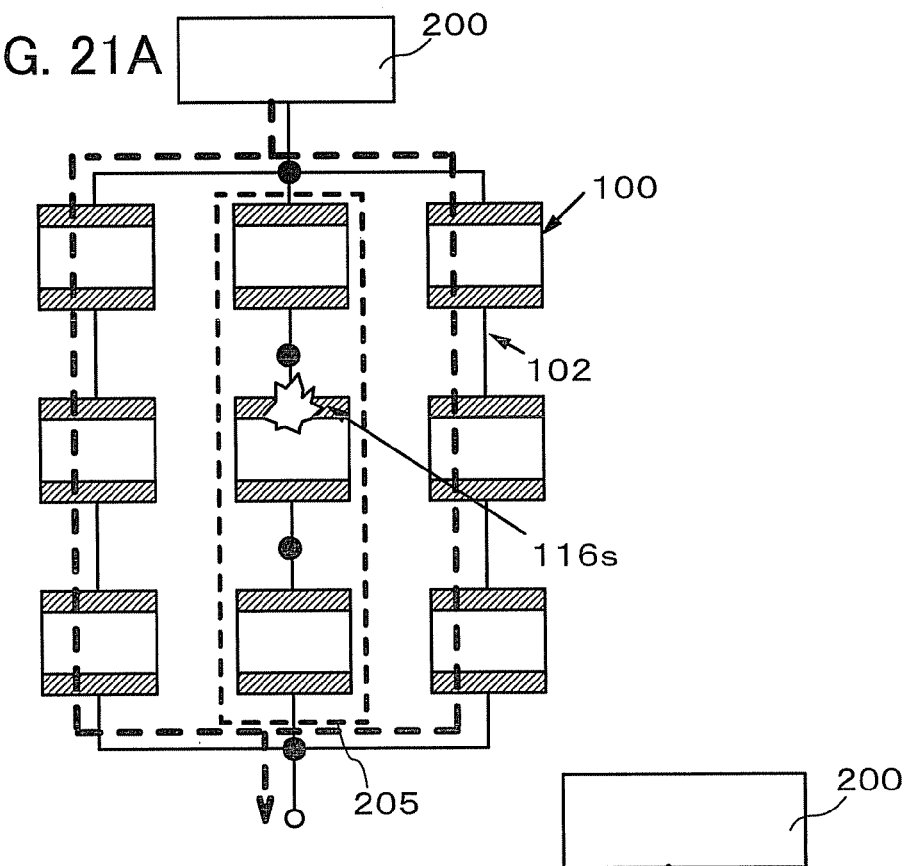
FIGS. 21A and 21B are circuit diagrams each illustrating a lighting device.

FIG. 21A is a circuit diagram illustrating the plurality of light-emitting elements which is not electrically connected to each other in parallel. In such a circuit structure, the light-emitting element group 205 including the light-emitting element with the defect 116s does not emit light as a whole. In other words, as shown by a dashed line, an electrical pathway from the power supply circuit 200 is formed only in the defectfree light-emitting element groups.

Figure 21B:
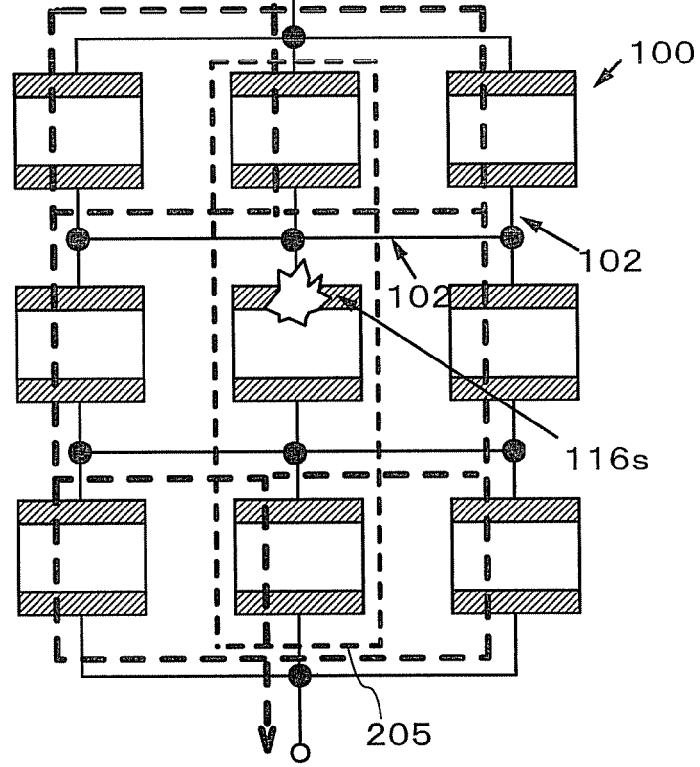

FIG. 21B is a circuit diagram illustrating the plurality of light-emitting elements which is electrically connected to each other in series and in parallel. In such a circuit structure, in the light-emitting element group 205 including the light-emitting element with the defect 116s, the light-emitting elements other than the light-emitting element including the defect 116s can emit light. In other words, as shown by a dashed line, an electrical pathway from the power supply circuit 200 can be formed in all defectfree light-emitting elements.

The light-emitting element with the defect 116s is in a dark state. At this time, voltage applied or current flowing to the other light-emitting elements is higher than that in the case where the defect is not generated. Accordingly, the other light-emitting elements can emit light with a luminance which compensate for the light-emitting element in a dark state. Unlike a display device, the lighting device includes a diffuser plate or the like for diffusing light; thus, the light-emitting element in a dark state is less likely to be recognized.

Such a disconnection defect might be generated owing to a potential defect or degradation with time. Even when such a defect is generated and disconnection occurs in a light-emitting element, as illustrated in FIG. 21B, the lighting device can be operated without a heavy burden on the other light-emitting elements.

(Embodiment 19)

In this embodiment, an example of an element structure of a light-emitting element which is used in a lighting device of the present invention will be described. A light-emitting element exhibiting organic EL emission generates a smaller amount of heat than an LED. Thus, an organic resin can be used for a housing, so that a reduction in weight of the lighting device is possible, which is preferable.

The light-emitting element illustrated in FIG. 22A includes the lower electrode 100b, the organic compound layer 100c over the lower electrode 100b, and the upper electrode 100a over the organic compound layer 100c.

The organic compound layer 100c includes at least a light-emitting layer containing a light-emitting organic compound. In addition, the organic compound layer 100c can have a stacked-layer structure in which a layer containing a substance having a high electron transport property, a layer containing a substance having a high hole transport property, a layer containing a substance having a high electron injection property, a layer containing a substance having a high hole injection property, a layer containing a bipolar substance (a substance having a high electron transport property and a high hole transport property), and the like are combined as appropriate. In this embodiment, an electron injection layer 705, an electron transport layer 704, a light-emitting layer 703, a hole transport layer 702, and a hole injection layer 701 are stacked in this order from the lower electrode 100b side in the organic compound layer 100c.

A method for manufacturing the light-emitting element illustrated in FIG. 22A will be described.

First, the lower electrode 100b is formed. The lower electrode 100b is provided on the side from which light is extracted, and indium oxide, ITO, an alloy of indium oxide and zinc oxide, zinc oxide, zinc oxide to which gallium is added, graphene, or the like can be used for the lower electrode 100b.

For the lower electrode 100b, a metal material such as gold, platinum, nickel, tungsten, chromium, molybdenum, iron, cobalt, copper, palladium, or titanium can be used. Alternatively, a nitride of the metal material (such as titanium nitride), or the like may be used. In the case of using the metal material (or the nitride thereof), the lower electrode 100b may be thinned so as to be able to transmit light.

Next, the organic compound layer 100c is formed over the lower electrode 100b. The organic compound layer 100c includes the electron injection layer 705, the electron transport layer 704, the light-emitting layer 703, the hole transport layer 702, and the hole injection layer 701.

The electron injection layer 705 is a layer containing a substance having a high electron injection property. For the electron injection layer 705, an alkali metal, an alkaline earth metal, or a compound thereof, such as lithium, cesium, calcium, lithium fluoride, cesium fluoride, calcium fluoride, or a lithium oxide, can be used. Further, a rare earth metal compound such as erbium fluoride can also be used. A substance for forming the electron transport layer 704 can also be used.

The electron transport layer 704 is a layer containing a substance having a high electron transport property. As the substance having a high electron transport property, any of the following can be used, for example: a metal complex or the like having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), or bis(2-methyl-8-quinolinolato)(4-phenylphenolato)aluminum (abbreviation: BAlq). Alternatively, a metal complex or the like including an oxazole-based or thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$), can be used. Other than the metal complexes, 2-(4-biphenylyl)-5-(4-tent-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), bathophenanthroline (abbreviation: BPhen), bathocuproine (abbreviation: BCP), or the like may be used. The substances mentioned here are mainly ones that have an electron mobility of $10^{-6}$ cm$^2$/V·s or higher. The electron transport layer is not limited to a single layer and may be formed of a stack of two or more layers containing any of the above substances.

The light-emitting layer 703 is a layer containing a light-emitting organic compound. As the light-emitting organic compound, for example, a fluorescent compound which exhibits fluorescence or a phosphorescent compound which exhibits phosphorescence can be used. The use of phosphorescent compounds for emission of all of red (R) light, green (G) light, and blue (B) light makes it possible to obtain high luminous efficiency.

The fluorescent compounds that can be used for the light-emitting layer 703 will be given. Examples of a material for blue light emission include N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and 4-(10-phenyl-9-anthryl)-4'-(9-phenyl-9H-carbazol-3-yl)triphenylamine (abbreviation: PCBAPA). Examples of a material for green light emission include N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA). Examples of a material for yellow light emission include rubrene and 5,12-bis(1,1'-biphenyl-4-yl)-6,11-diphenyltetracene (abbreviation: BPT). Examples of a material for red light emission include N,N,N',N'-tetrakis(4-methylphenyl)tetracene-5,11-diamine (abbreviation: p-mPhTD) and 7,14-diphenyl-N,N,N',N'-tetrakis(4-methylphenyl)acenaphtho[1,2-a]fluoranthene-3,10-diamine (abbreviation: p-mPhAFD).

The phosphorescent compounds that can be used for the light-emitting layer 703 will be given. Examples of a material for blue light emission include bis[2-(4',6'-difluorophenyl)pyridinato-N,C$^2$']iridium(III) tetrakis(1-pyrazolyl)borate (abbreviation: FIr6), bis[2-(4',6'-difluorophenyl)pyridinato-N,C$^2$']iridium(III) picolinate (abbreviation: FIrpic), bis{2-[3',5'-bis(trifluoromethyl)phenyl]pyridinato-N,C$^{2'}$}iridium (III) picolinate (abbreviation: Ir(CF$_3$ppy)$_2$(pic)), and bis[2-(4',6'-difluorophenyl)pyridinato-N,C$^{2'}$]iridium(III) acetylacetonate (abbreviation: FIr(acac)). Examples of a material for green light emission include tris(2-phenylpyridinato-N,C$^{2'}$)iridium(III) (abbreviation: Ir(ppy)$_3$), bis(2-phenylpyridinato-N,C$^{2'}$)iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$). Examples of a material for yellow light emission include bis(2,4-diphenyl-1,3-oxazolato-N,C$^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N,C$^{2'}$)iridium(III)acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), and (acetylacetonato)bis[2-(4-methoxyphenyl)-3,5-dimethylpyrazinato]iridium(III) (abbreviation: Ir(dmmoppr)$_2$ (acac)). Examples of a material for orange light emission include tris(2-phenylquinolinato-N,C$^{2'}$)iridium(III) (abbreviation: Ir(pq)$_3$), bis(2-phenylquinolinato-N,C$^{2'}$)iridium(III)acetylacetonate (abbreviation: Ir(pq)$_2$(acac)), (acetylacetonato)bis(3,5-dimethyl-2-phenylpyrazinato)iridium(III) (abbreviation: Ir(mppr-Me)2(acac)), and (acetylacetonato)bis(5-isopropyl-3-methyl-2-phenylpyrazinato)iridium(III) (abbreviation: Ir(mppr-iPr)$_2$(acac)). Examples of a material for red light emission include organometallic complexes such as bis[2-(2'-benzo[4,5-α]thienyppyridinato-N,C$^{3'}$]iridium(III)acetylacetonate (abbreviation: Ir(btp)$_2$(acac)), bis(1-phenylisoquinolinato-N,C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium(III) (abbreviation: Ir(tppr)$_2$(dpm)), and 2,3,7,8,12,13,17,18-octaethyl-21H,23H-porphyrinplatinum(III) (abbreviation: PtOEP). Further, rare-earth metal complexes, such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light from rare-earth metal ions (electron transition between different multiplicities), and thus can be used as phosphorescent compounds.

Note that the light-emitting layer 703 may have a structure in which the above light-emitting organic compound (a guest material) is dispersed in another substance (a host material). As a host material, a variety of kinds of materials can be used, and it is preferable to use a substance which has a lowest unoccupied molecular orbital level (LUMO level) higher than that of the light-emitting material and has a highest occupied molecular orbital level (HOMO level) lower than that of the light-emitting material.

Specific examples of the host material include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation Znq), bis[2-(2-benzoxazolyl)phenolato]zinc(II) (abbreviation: ZnPBO), and bis[2-(2-benzothiazoly)phenolato]zinc(II) (abbreviation: ZnBTZ); heterocyclic compounds such as 2-(4-biphenylyl)-5-(4-tent-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2"-(1,3,5-benzenetriyl)tris(1-phenyl-1H-benzimidazole) (abbreviation: TPBI), bathophenanthroline (abbreviation: BPhen), and bathocuproine (abbreviation: BCP); condensed aromatic compounds such as 9-[4-(10-phenyl-9-anthryl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 3,3',3"-(benzene-1,3,5-triyl)tripyrene (abbreviation: TPB3), 9,10-diphenylanthracene (abbreviation: DPAnth), and 6,12-dimethoxy-5,11-diphenylchrysene; and aromatic amine compounds such as N,N-dipheyl-9-[4-(10-phenyl-9-anthryl)phenyl]-9H-carbazol-3-amine (abbreviation: CzAlPA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}-9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLDPBi, and BSPB.

As the host material, plural kinds of materials can be used. For example, in order to suppress crystallization, a substance such as rubrene which suppresses crystallization may be further added. In addition, NPB, Alq, or the like may be further added in order to efficiently transfer energy to a guest material.

When a structure in which a guest material is dispersed in a host material is employed, crystallization of the light-emitting layer 703 can be suppressed. Further, concentration quenching due to high concentration of the guest material can be suppressed.

For the light-emitting layer 703, a high molecular compound can be used. Specifically, examples of a material for blue light emission include poly(9,9-dioctylfluorene-2,7-diyl) (abbreviation: PFO), poly[(9,9-dioctylfluorene-2,7-diyl)-co-(2,5-dimethoxybenzene-1,4-diyl)] (abbreviation: PF-DMOP), and poly{(9,9-dioctylfluorene-2,7-diyl)-co-[N,N'-di-(p-butylphenyl)-1,4-diaminobenzene]} (abbreviation: TAB-PFH). Examples of a material for green light emission include poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), and poly[(9,9-dioctyl-2,7-divinylenfluorenylene)-alt-co-(2-methoxy-5-(2-ethylhexyloxy)-1,4-phenylene)]. Examples of a material for orange to red light emission include poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenyl amino)-1,4-phenylene]}, and poly{[2-methoxy-5-(2-ethylhexyloxy)-1,4-bis(1-cyanovinylenephenylene)]-alt-co-[2,5-bis(N,N'-diphenylamino)-1,4-phenylene]} (abbreviation: CN-PPV-DPD).

Note that the light-emitting layer may have a stacked-layer structure of two or more layers. When the light-emitting layer has a stacked-layer structure of two or more layers and the kinds of light-emitting substances for light-emitting layers vary, a variety of emission colors can be obtained. In addition, a plurality of light-emitting substances of different colors is used as the light-emitting substances, whereby light emission having a broad spectrum or white light emission can also be obtained. For a lighting device in which high luminance is required, a structure in which light-emitting layers are stacked is preferable.

The hole transport layer 702 is a layer containing a substance having a high hole transport property. As the substance having a high hole transport property, any of the following aromatic amine compounds can be used, for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). The substances mentioned here are mainly ones that have a hole mobility of $10^{-6}$ cm$^2$/V·s or higher. Note that any other substance may be used as long as the hole transport property thereof is higher than the electron transport property thereof. Note that the layer containing a substance having a high hole transport property is not limited to a single layer and may be formed of a stack of two or more layers containing any of the above substances.

For the hole transport layer 702, a carbazole derivative such as CBP, CzPA, or PCzPA or an anthracene derivative such as t-BuDNA, DNA, or DPAnth may be used.

Alternatively, for the hole transport layer 702, a high molecular compound such as PVK, PVTPA, PTPDMA, or Poly-TPD may be used.

The hole injection layer 701 is a layer containing a substance having a high hole injection property. As the substance having a high hole injection property, for example, a metal oxide such as a molybdenum oxide, a titanium oxide, a vanadium oxide, a rhenium oxide, a ruthenium oxide, a chromium oxide, a zirconium oxide, a hafnium oxide, a tantalum oxide, a silver oxide, a tungsten oxide, or a manganese oxide can be used. A phthalocyanine-based compound such as phthalocyanine (abbreviation: H$_2$Pc) or copper(II) phthalocyanine (abbreviation: CuPc) may be used.

Also, an aromatic amine compound or the like which is a low molecular organic compound such as 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazol-3-yl)-N-phenylamino]-9-phenylcarbazole (abbreviation: PCzPCA1), 3,6-b is [N-(9-phenylcarbazol-3-yl)-N-phenylamino]-9-phenylcarbazole (abbreviation: PCzPCA2), or 3-[N-(1-naphthyl)-N-(9-phenylcarbazol-3-yl)amino]-9-phenylcarbazole (abbreviation: PCzPCN1), can be used.

Besides, any of high molecular compounds (e.g., oligomers, dendrimers, and polymers) may be used. Examples of the high molecular compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD). A high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), may be used.

For the hole injection layer 701, a composite material in which an organic compound having a high hole transport property is mixed with an acceptor substance is preferably used. With the use of the composite material in which an organic compound having a high hole transport property is mixed with an acceptor substance, excellent hole injection from the upper electrode 100a can be obtained, which results in a reduction in driving voltage of the light-emitting element. Such a composite material can be formed by co-evaporation of a substance having a high hole transport property and an acceptor substance. The hole injection layer 701 is formed using the composite material, whereby hole injection from the upper electrode 100a to the organic compound layer 100c is facilitated.

As the organic compound for the composite material, any of a variety of compounds such as aromatic amine compounds, carbazole derivatives, aromatic hydrocarbons, and high molecular compounds (e.g., oligomers, dendrimers, and polymers) can be used. The organic compound used for the composite material is preferably an organic compound having a high hole transport property. Specifically, a substance having a hole mobility of $10^{-6}$ cm$^2$V·s or higher is preferably used. Note that any other substance may be used as long as the hole transport property thereof is higher than the electron transport property thereof. Specific examples of the organic compound that can be used for the composite material are given below.

Examples of the organic compound that can be used for the composite material include aromatic amine compounds such as TDATA, MTDATA, DPAB, DNTPD, DPA3B, PCzPCA1, PCzPCA2, PCzPCN1, 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP), and carbazole compounds such as 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CzPA), 9-phenyl-3-[4-(10-phenyl-9-anthryl)phenyl]-9H-carbazole (abbreviation: PCzPA), and 1,4-bis[4-(N-carbazolyl)phenyl]-2,3,5,6-tetraphenylbenzene.

Further, any of the following aromatic hydrocarbon compounds may be used: 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, and the like.

Furthermore, any of the following aromatic hydrocarbon compounds may be used: 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, coronene, 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Examples of an electron acceptor include organic compounds such as 7,7,8,8-tetracyano-2,3,5,6-tetrafluoroquinodimethane (abbreviation: F$_4$-TCNQ) and chloranil; and transition metal oxides. Other examples include oxides of metals belonging to Groups 4 to 8 in the periodic table. Specifically, vanadium oxide, niobium oxide, tantalum oxide, chromium oxide, molybdenum oxide, tungsten oxide, manganese oxide, and rhenium oxide are preferable because of their high electron accepting property. Molybdenum oxide is preferable because it is stable in the air, has a low hygroscopic property, and is easily handled.

The composite material may be formed using the above electron acceptor and the above high molecular compound such as PVK, PVTPA, PTPDMA, or Poly-TPD and used for the hole injection layer 701.

Note that the electron injection layer 705, the electron transport layer 704, the light-emitting layer 703, the hole transport layer 702, and the hole injection layer 701 which are described above can each be formed by an evaporation method (e.g., a vacuum evaporation method), an ink-jet method, a coating method, or the like.

A plurality of organic compound layers 100c may be stacked between the lower electrode 100b and the upper electrode 100a as illustrated in FIGS. 22B1 and 22B2. FIG. 22B1 illustrates an example in which a first organic compound layer 100c and a second organic compound layer 100d are provided between the lower electrode 100b and the upper electrode 100a. A charge generation layer 803 is provided between the first organic compound layer 100c and the second organic compound layer 100d. FIG. 22B2 illustrates an example in which the first organic compound layer 100c, the second organic compound layer 100d, and a third organic compound layer 100e are provided between the lower electrode 100b and the upper electrode 100a. A charge generation layer 803a is provided between the first organic compound layer 100c and the second organic compound layer 100d and a charge generation layer 803b is provided between the second organic compound layer 100d and the third organic compound layer 100e.

The charge generation layers 803, 803a, and 803b can each be formed using the above composite material. Further, the charge generation layers 803, 803a, and 803b may each have a stacked-layer structure of a layer containing the composite material and a layer containing another material. In that case, as the layer containing another material, a layer containing an electron donating substance and a substance having a high electron transport property, a layer formed of a transparent conductive film, or the like can be used. As for a light-emitting element having such a structure, problems such as energy transfer and quenching are less likely to occur, and thus a light-emitting element which has both high luminous efficiency and long lifetime can be easily obtained owing to expansion in the choice of materials. Moreover, a light-emitting element which provides phosphorescence and fluorescence can be readily obtained.

When the charge generation layer is provided between the stacked organic compound layers as illustrated in FIGS. 22B1 and 22B2, the element can have high luminance and a long lifetime while the current density is kept low. In addition, a voltage drop due to resistance of an electrode material can be reduced, whereby uniform light emission in a large area is possible.

In the case of a stack-type element having a structure in which two organic compound layers are stacked, white light emission can be extracted outside. White light emission is extracted outside by allowing the first organic compound layer and the second organic compound layer to emit light of complementary colors. Note that white light emission can also be obtained with a structure including a plurality of light-emitting layers in which light emission color of the first organic compound layer and light emission color of the second organic compound layer are colors complementary to each other. As complementary relations, blue and yellow, blue-green and red, and the like can be given. A substance which emits blue light, yellow light, blue-green light, or red light may be selected as appropriate from, for example, the light-emitting substances given above.

An example of a light-emitting element having a structure in which a plurality of organic compound layers is stacked will be described below. First, an example of a structure in which each of the first organic compound layer and the second organic compound layer includes a plurality of light-emitting layers which emit light of complementary colors will be described. With this structure, white light emission can be obtained.

For example, the first organic compound layer includes a first light-emitting layer which has an emission spectrum with a peak in the wavelength range of blue to blue-green, and a second light-emitting layer which has an emission spectrum with a peak in the wavelength range of yellow to orange. The second organic compound layer includes a third light-emitting layer which has an emission spectrum with a peak in the wavelength range of blue-green to green, and a fourth light-emitting layer which has an emission spectrum with a peak in the wavelength range of orange to red.

In this case, light emission from the first organic compound layer is a combination of light emission from both the first light-emitting layer and the second light-emitting layer and thus exhibits an emission spectrum having both a peak in the wavelength range of blue to blue-green and a peak in the wavelength range of yellow to orange. That is, the first organic compound layer emits light of two-wavelength type white or a two-wavelength type color close to white.

In addition, light emission from the second organic compound layer is a combination of light emission from both the third light-emitting layer and the fourth light-emitting layer and thus exhibits an emission spectrum having both a peak in the wavelength range of blue-green to green and a peak in the wavelength range of orange to red. That is, the second organic compound layer emits light of two-wavelength type white color or a two-wavelength type color close to white, which is different from that of the first organic compound layer.

Accordingly, by combining the light emission from the first organic compound layer and the light emission from the second organic compound layer, white light emission which covers the wavelength range of blue to blue-green, the wavelength range of blue-green to green, the wavelength range of yellow to orange, and the wavelength range of orange to red can be obtained.

Further, the wavelength range of yellow to orange (greater than or equal to 560 nm and less than 580 nm) is a wavelength range of high spectral luminous efficacy; thus, application of a light-emitting layer having an emission spectrum peak in the wavelength range of yellow to orange is useful. For example, a structure can be used in which a first organic compound layer which includes a light-emitting layer having an emission spectrum peak in a blue wavelength range, a second organic compound layer which includes a light-emitting layer having an emission spectrum peak in an yellow wavelength range, and a third organic compound layer which includes a light-emitting layer having an emission spectrum peak in a red wavelength range are stacked.

Further, two or more organic compound layers exhibiting yellow to orange color may be stacked. The power efficiency can be further improved by stacking two or more organic compound layers exhibiting yellow to orange color.

For example, in the case of a light-emitting element in which three organic compound layers are stacked as in FIG. 22B2, a second organic compound layer and a third organic compound layer each of which includes a light-emitting layer having an emission spectrum peak in yellow to orange wavelength range may be stacked over a first organic compound layer which includes a light-emitting layer having an emission spectrum peak in a blue wavelength range (greater than or equal to 400 nm and less than 480 nm). Note that the wavelengths of the peaks of the spectra of light emitted from the second organic compound layer and the third organic compound layer may be the same or different from each other.

When the number of organic compound layers which are stacked is increased, the power efficiency of a light-emitting element can be improved; however, there occurs a problem that the manufacturing process becomes complicated. Thus, the structure in which three organic compound layers are stacked as in FIG. 22B2 is preferable because the power efficiency is high as compared to the case of a structure of two organic compound layers and the manufacturing process is simple as compared to the case of a structure of four or more organic compound layers.

The use of the organic compound layer which has an emission spectrum peak in the yellow to orange wavelength range makes it possible to utilize the wavelength range of high spectral luminous efficacy, allowing power efficiency to increase. Accordingly, the power efficiency of the whole light-emitting element can be increased. Such a structure is advantageous in terms of spectral luminous efficacy and thus enables improvement in power efficiency as compared to the case where, for example, an organic compound layer which emits green light and an organic compound layer which emits red light are stacked to obtain a light-emitting element which emits yellow to orange light. Further, the emission intensity of light of the blue wavelength range of low spectral luminous efficacy is relatively low as compared to the case of using one organic compound layer which has an emission spectrum peak in the yellow to orange wavelength range of high spectral luminous efficacy; thus, the color of emitted light is close to incandescent color (or warm white), and the power efficiency is improved.

In other words, in the above light-emitting element, the color of light (i.e., the color of light emitted from the light-emitting element) which is obtained by combining light whose emission spectrum peak is in the yellow to orange wavelength range and whose wavelength of the peak is greater than or equal to 560 nm and less than 580 nm and light whose emission spectrum peak is in the blue wavelength range can be natural color like warm white or incandescent color. Incandescent color can be easily achieved.

As a light-emitting substance which emits light having a peak in the yellow to orange wavelength range, for example, an organometallic complex in which a pyrazine derivative functions as a ligand can be used. Alternatively, the light-emitting layer may be formed by dispersing a light-emitting substance (a guest material) in another substance (a host material). A phosphorescent compound can be used as the light-emitting substance which emits light having a peak in the yellow to orange wavelength range. The power efficiency in the case of using a phosphorescent compound is three to four times as high as that in the case of using a fluorescent compound. The above organometallic complex in which a pyrazine derivative functions as a ligand is a phosphorescent compound, has high emission efficiency, and easily emits light in the yellow to orange wavelength range, and thus is favorable.

As a light-emitting substance which emits light having a peak in the blue wavelength range, for example, a pyrene diamine derivative can be used. A fluorescent compound can be used as the light-emitting substance which emits light having a peak in the blue wavelength range. The use of a fluorescent compound makes it possible to obtain a light-emitting element which has a longer lifetime than a light-emitting element in which a phosphorescent compound is used. The above pyrene diamine derivative is a fluorescent compound, can obtain an extremely high quantum yield, and has a long lifetime; thus, the above pyrene diamine derivative is favorable.

As illustrated in FIG. 22C, the organic compound layer 100c may include a composite material layer 708, an electron relay layer 707, an electron injection buffer layer 706, the electron transport layer 704, the light-emitting layer 703, the hole transport layer 702, and the hole injection layer 701, between the lower electrode 100b and the upper electrode 100a.

The composite material layer 708 can be formed using the above composite material in which an organic compound having a high hole transport property is mixed with an acceptor substance.

Further, by providing the electron injection buffer layer 706, an injection barrier between the composite material layer 708 and the electron transport layer 704 can be reduced; thus, electrons generated in the composite material layer 708 can be easily injected to the electron transport layer 704.

Any of the following substances having high electron injection properties can be used for the electron injection buffer layer 706: an alkali metal, an alkaline earth metal, a rare earth metal, a compound of the above metal (e.g., an alkali metal compound (e.g., an oxide such as lithium oxide, a halide, or carbonate such as lithium carbonate or cesium carbonate), an alkaline earth metal compound (e.g., an oxide, a halide, or carbonate), or a rare earth metal compound (e.g., an oxide, a halide, or carbonate)), and the like.

Further, in the case where the electron injection buffer layer 766 contains a substance having a high electron transport property and a donor substance, the donor substance is preferably added so that the mass ratio of the donor substance to the substance having a high electron transport property is from 0.001:1 to 0.1:1. Note that examples of the donor substance include organic compounds such as tetrathianaphthacene (abbreviation: TTN), nickelocene, and decamethylnickelocene, in addition to an alkali metal, an alkaline earth metal, a rare earth metal, and compounds of the above metals (e.g., alkali metal compounds (including an oxide such as lithium oxide, a halide, and carbonates such as lithium carbonate and cesium carbonate), alkaline earth metal compounds (including an oxide, a halide, and a carbonate), and rare earth metal compounds (including an oxide, a halide, and a carbonate)). Note that as the substance having a high electron transport property, a material similar to the material for the electron transport layer 704 described above can be used.

Furthermore, the electron relay layer 707 is preferably formed between the electron injection buffer layer 706 and the composite material layer 708. The electron relay layer 707 is not necessarily provided; however, by providing the electron relay layer 707 having a high electron transport property, electrons can be rapidly transported to the electron injection buffer layer 706.

The structure in which the electron relay layer 707 is provided between the composite material layer 708 and the electron injection buffer layer 706 is a structure in which the acceptor substance contained in the composite material layer 708 and the donor substance contained in the electron injection buffer layer 706 are less likely to interact with each other, and thus their functions hardly interfere with each other. Accordingly, an increase in driving voltage can be prevented.

The electron relay layer 707 contains a substance having a high electron transport property and is formed so that the LUMO level of the substance having a high electron transport property is located between the LUMO level of the acceptor substance contained in the composite material layer 708 and the LUMO level of the substance having a high electron transport property contained in the electron transport layer 704. In the case where the electron relay layer 707 contains a donor substance, the donor level of the donor substance is controlled so as to be located between the LUMO level of the acceptor substance in the composite material layer 708 and the LUMO level of the substance having a high electron transport property contained in the electron transport layer 704. As a specific value of the energy level, the LUMO level of the substance having a high electron transport property contained in the electron relay layer 707 is preferably greater than or equal to −5.0 eV, more preferably greater than or equal to −5.0 eV and less than or equal to −3.0 eV.

As the substance having a high electron transport property contained in the electron relay layer 707, a phthalocyanine-based material or a metal complex having a metal-oxygen bond and an aromatic ligand is preferably used.

As the phthalocyanine-based material contained in the electron relay layer 707, specifically, any of the following is preferably used: CuPc; a phthalocyanine tin(II) complex (SnPc); a phthalocyanine zinc complex (ZnPc); cobalt(II) phthalocyanine, β-form (CoPc); phthalocyanine iron (FePc); and vanadyl 2,9,16,23-tetraphenoxy-29H,31H-phthalocyanine (PhO-VOPc).

As the metal complex having a metal-oxygen bond and an aromatic ligand, which is contained in the electron relay layer 707, a metal complex having a metal-oxygen double bond is preferably used. The metal-oxygen double bond has an acceptor property (a property of easily accepting electrons); thus, electrons can be transferred (donated and accepted) more easily. Further, the metal complex which has a metal-oxygen double bond is considered stable. Thus, the use of the metal complex having a metal-oxygen double bond makes it possible to drive the light-emitting element at low voltage more stably.

As the metal complex having a metal-oxygen bond and an aromatic ligand, a phthalocyanine-based material is preferable. Specifically, any of vanadyl phthalocyanine (VOPc), a phthalocyanine tin(IV) oxide complex (SnOPc), and a phthalocyanine titanium oxide complex (TiOPc) is preferable because a metal-oxygen double bond is more likely to act on another molecular in terms of a molecular structure and an acceptor property is high.

Note that as the phthalocyanine-based material described above, a phthalocyanine-based material having a phenoxy group is preferable. Specifically, a phthalocyanine derivative having a phenoxy group, such as PhO-VOPc, is preferable. A phthalocyanine derivative having a phenoxy group is soluble in a solvent; thus, the phthalocyanine derivative has an advantage of being easily handled during formation of a light-emitting element and an advantage of facilitating maintenance of an apparatus used for film formation.

The electron relay layer 707 may further contain a donor substance. Examples of the donor substance include organic compounds such as tetrathianaphthacene (abbreviation: TTN), nickelocene, and decamethylnickelocene, in addition to an alkali metal, an alkaline earth metal, a rare earth metal, and compounds of the above metals (e.g., alkali metal compounds (including an oxide such as lithium oxide, a halide, and carbonates such as lithium carbonate and cesium carbonate), alkaline earth metal compounds (including an oxide, a halide, and a carbonate), and rare earth metal compounds (including an oxide, a halide, and a carbonate)). When such a donor substance is contained in the electron relay layer 707, electrons can be transferred easily and the light-emitting element can be driven at lower voltage.

In the case where a donor substance is contained in the electron relay layer 707, other than the materials described above as the substance having a high electron transport property, a substance having a LUMO level greater than the acceptor level of the acceptor, substance contained in the composite material layer 708 may be used. Specifically, it is preferable to use a substance that has a LUMO level greater than or equal to −5.0 eV, preferably in a range greater than or equal to −5.0 eV and less than or equal to −3.0 eV. As examples of such a substance, a perylene derivative and a nitrogen-containing condensed aromatic compound can be given. Note that a nitrogen-containing condensed aromatic compound is preferably used for the electron relay layer 707 because of its stability.

As specific examples of the perylene derivative, the following can be given: 3,4,9,10-perylenetetracarboxylic dianhydride (abbreviation: PTCDA), 3,4,9,10-perylenetetracarboxylic-bis-benzimidazole (abbreviation: PTCBI), N,N'-dioctyl-3,4,9,10-perylenetetracarboxylic diimide (abbreviation: PTCDI-C8H), and N,N'-dihexyl-3,4,9,10-perylenetetracarboxylic diimide (abbreviation: Hex PTC).

As specific examples of the nitrogen-containing condensed aromatic compound, the following can be given: pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), and 2,3-bis(4-fluorophenyl)pyrido[2,3-b]pyrazine (abbreviation: F2PYPR).

Other examples are 7,7,8,8-tetracyanoquinodimethane (abbreviation: TCNQ), 1,4,5,8-naphthalenetetracarboxylic dianhydride (abbreviation: NTCDA), perfluoropentacene, copper hexadecafluoro phthalocyanine (abbreviation: F$_{16}$CuPc), N,N'-bis(2,2,3,3,4,4,5,5,6,6,7,7,8,8-pentadecafluorooctyl)-1,4,5,8-naphthalenetetracar boxylic diimide (abbreviation: NTCDI-C8F), 3',4'-dibutyl-5,5"-bis(dicyanomethylene)-5,5"-dihydro-2,2':5',2"terthiophene (abbreviation: DCMT), and methanofullerene (e.g., [6,6]-phenyl C$_{61}$ butyric acid methyl ester).

Note that in the case where a donor substance is contained in the electron relay layer 707, the electron relay layer 707 may be formed by a method such as co-evaporation of the substance having a high electron transport property and the donor substance.

The hole injection layer 701, the hole transport layer 702, the light-emitting layer 703, and the electron transport layer 704 may each be formed using any of the above materials.

Then, the upper electrode 100a is formed over the organic compound layer 100c.

The upper electrode 100a is provided on the side opposite to the direction in which light is extracted from the organic compound layer 100e and is formed using a reflective material. As the reflective material, a metal material such as aluminum, gold, platinum, silver, nickel, tungsten, chromium, molybdenum, iron, cobalt, copper, or palladium can be used. Further, any of the following may be used: alloys containing aluminum (aluminum alloys) such as an alloy of aluminum and titanium, an alloy of aluminum and nickel, and an alloy of aluminum and neodymium; and an alloy containing silver, such as an alloy of silver and copper. An alloy of silver and copper is preferable because of its high heat resistance. Further, a metal film or a metal oxide film is stacked on an aluminum alloy film, whereby oxidation of the aluminum alloy film can be suppressed. As examples of a material of the metal film or the metal oxide film, titanium and titanium oxide can be given. The above materials are preferable because they are present in large amounts in the Earth's crust and inexpensive; thus, a reduction in manufacturing cost of a light-emitting element can be achieved.

Although the case of using an organic EL element is described in this embodiment, an inorganic EL element may be used instead of an organic EL element. In the case of forming an inorganic EL element, an inorganic compound layer (e.g., a pair of dielectric layers and a sulfide layer (a zinc sulfide layer, an aluminum sulfide layer, or the like) provided therebetween) may be used instead of an organic compound layer.

Note that this embodiment can be combined with any of the other embodiments as appropriate.

(Embodiment 20)

In this embodiment, one embodiment of a lighting device of the present invention will be described.

Although examples of the lighting devices where the upper electrode, the lower electrode, and the organic compound layer are rectangular and the plurality of light-emitting elements is arranged in matrix are described in the above embodiments, shapes and arrangement are not limited thereto.

Figure 26:
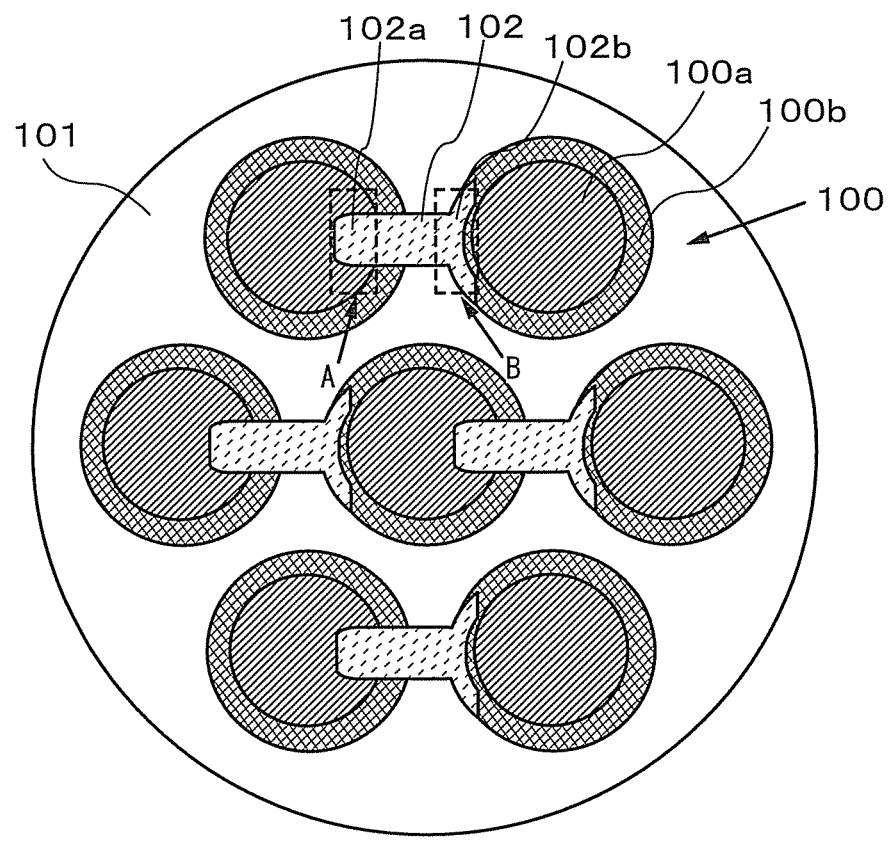
FIG. 26 is a cross-sectional view illustrating a lighting device.

FIG. 26 illustrates a lighting device in which the light-emitting element including the upper electrode, the lower electrode, and the organic compound layer is circular. Note that the first substrate 101 is also circular. The light-emitting element 100 includes the circular upper electrode 100a and the circular lower electrode 100b. The organic compound layer is provided between the upper electrode 100a and the lower electrode 100b. The plurality of circular light-emitting elements can be electrically connected to each other through the connection wiring 102. The connection wiring 102 has a circular portion; a portion overlapping with the lower electrode 100b has a partial circular shape (curved shape) along the shape of the lower electrode. Thus, the electrical connection can be formed.

The plug 102a is provided so that the connection wiring 102 is electrically connected to the upper electrode 100a. The plug 102a is provided in a region A where the upper electrode 100a overlaps with the connection wiring 102. The plug 102b is provided so that the connection wiring 102 is electrically connected to the lower electrode 100b. The plug 102b is provided in a region B where the lower electrode 100b overlaps with the connection wiring 102.

The light-emitting element may have a polygonal shape (including a tetragon) as well as a circular shape. For example, a plurality of hexagonal light-emitting elements may be arranged over the circular first substrate 101. In the case of the hexagonal light-emitting element, the distance between adjacent light-emitting elements can be the minimum. The connection wiring 102 preferably has a portion along the hexagonal shape. Thus, the electrical connection can be formed.

(Embodiment 21)

In this embodiment, one embodiment of a lighting device of the present invention will be described.

Figure 23:
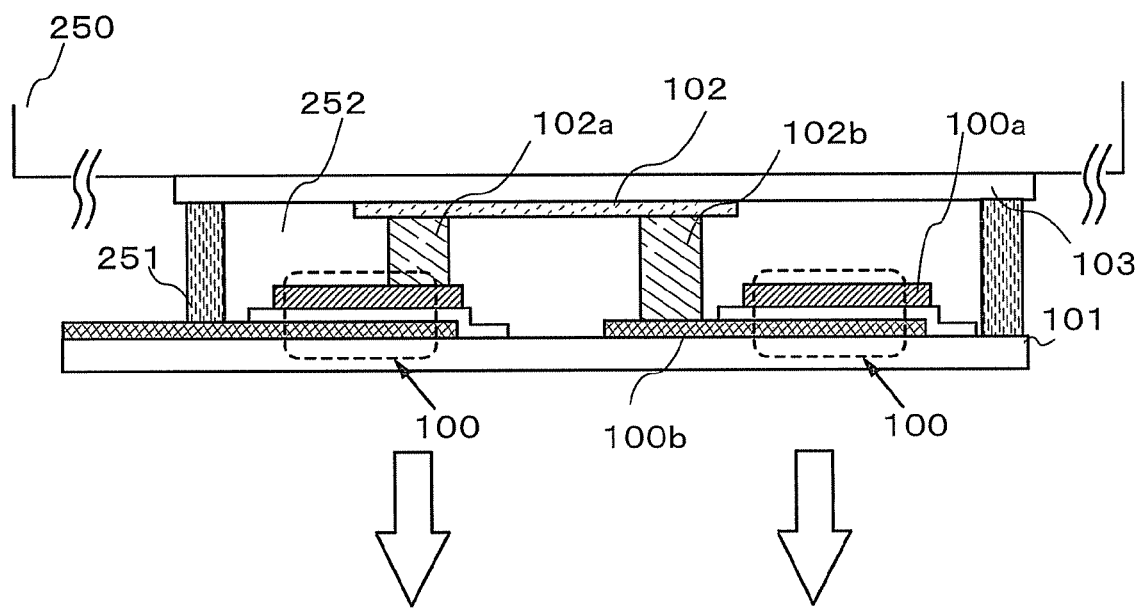
FIG. 23 is a cross-sectional view illustrating a lighting device.

FIG. 23 illustrates an example of the lighting device provided on a ceiling 250. The lighting device can be detachable from the ceiling 250. In that case, the lighting device can be provided with a mechanism for detaching while the ceiling can be provided in advance with a mechanism for installation which fits the mechanism for detaching of the lighting device. Alternatively, the lighting device can be incorporated in the ceiling. In this case, an opening can be provided in a part of the ceiling so that the lighting device is embedded therein.

The lighting device is sealed with a sealant 251 or the like. A space 252 formed by sealing contains as little oxygen and moisture as possible. For this reason, the space 252 may be filled with an inert gas such as nitrogen. A desiccant or the like may be provided in the space 252. A desiccant can be included in the sealant 251 or the plug 102a or 102b. Alternatively, a sheet-like desiccant can be attached to the second substrate (counter substrate) 103.

Such a lighting device, which has the bottom emission structure as shown by arrows, will be described. As described in the above embodiments, the bottom emission structure can be fabricated when the lower electrode 100b of the light-emitting element has a light-transmitting property. Thus, the upper electrode 100a, the connection wiring 102, and the plugs 102a and 102b do not need to have light-transmitting properties, and may be formed using metal materials or the like without light-transmitting properties. Since a metal material has generally low resistance, it is suitable for materials for the connection wiring 102 and the plugs 102a and 102b.

Heat is generated in accordance with light emission of the light-emitting element in the lighting device. Since heat is conducted through an object and radiated to the air, the heat can pass through the plugs 102a and 102b and the connection wiring 102 to the ceiling when the connection wiring 102 is provided on the ceiling side. Accordingly, the heat can be radiated to the outside the lighting device more efficiently than the case where the heat is radiated to the air.

(Embodiment 22)

In this embodiment, application examples of a lighting device will be described.

Figure 24:
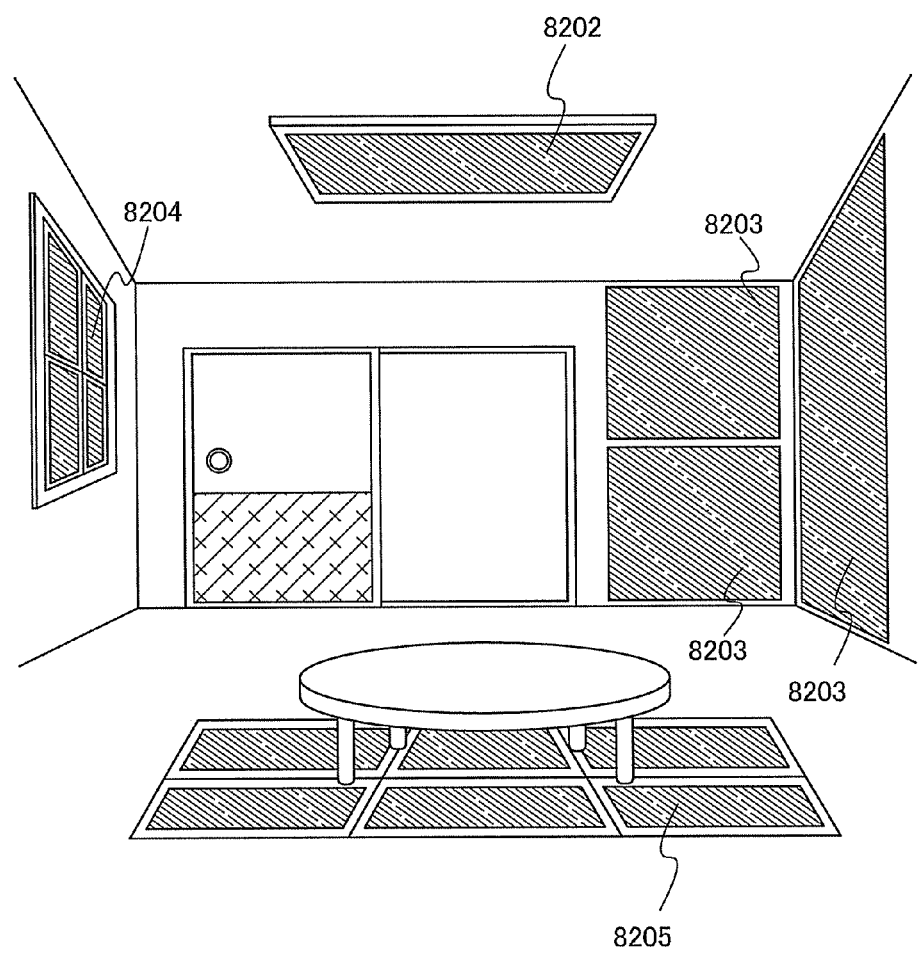
FIG. 24 is a diagram illustrating application examples of a lighting device.

FIG. 24 illustrates an example in which the lighting device according to one embodiment of the present invention is used as an indoor lighting device. The lighting device according to one embodiment of the present invention can be used not only as a ceiling-mounted lighting device 8202 but also as a wall-mounted lighting device 8204 and a floor-mounted lighting device 8205. Further, since the lighting device according to one embodiment of the present invention can be increased in size, it is also possible that a wall surface itself serves as a light source like lighting devices 8203 so that a room is illuminated.

The lighting device according to one embodiment of the present invention has a surface light source in which a light source is a plane; thus, the number of components such as a light-reflecting plate can be reduced as compared to the case of using a point light source. Further, the lighting device according to one embodiment of the present invention is preferably used as an indoor lighting device because it has an advantage such as less heat generation as compared to an incandescent bulb.

Figure 25:
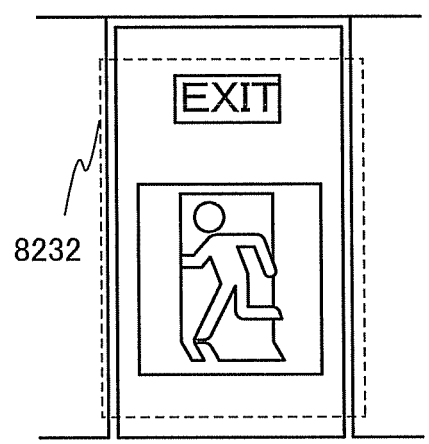
FIG. 25 is a diagram illustrating an application example of a lighting device.

Next, an example in which the lighting device according to one embodiment of the present invention is applied to an emergency exit light is illustrated in FIG. 25.

FIG. 25 illustrates an example of the appearance of an emergency exit light. An emergency exit light 8232 can be formed by combination of the lighting device and a fluorescent plate provided with a fluorescent portion. Alternatively, the emergency exit light 8232 may be formed by combination of a lighting device which emits light of a specific color and a light-blocking plate provided with a transmissive portion with a shape illustrated in the drawing. The lighting device according to one embodiment of the present invention can emit light with a constant luminance, and thus is preferably used as an emergency exit light that needs to be on at all times.

The lighting device according to one embodiment of the present invention can have a large area and high reliability.

FIG. 27 illustrates an example in which the lighting device according to one embodiment of the present invention is used as a light source in the case of the cultivation of a plant in a space where internal environment is controlled. For example, a lighting device 8302 is provided on a ceiling. A plant 8303 or the like illuminated by the lighting device grows. In such a space, the lighting device may be provided on a wall or at the same level as the plant. Since the lighting device according to one embodiment of the present invention can be used as a surface light source which can have a large area, it is suitable for a lighting device for a large plant-cultivation facility. In the case of an artificial light source, a light-emitting material can be selected as appropriate to obtain light having a wavelength needed for the cultivation of a plant. Thus, the plant can grow better than in the case of the cultivation of a plant with natural light.

Note that what is described in this embodiment with reference to each drawing can be freely combined with or replaced with what is described in any of the other embodiments as appropriate.

This application is based on Japanese Patent Application serial no. 2011-034160 filed with Japan Patent Office on Feb. 21, 2011, the entire contents of which are hereby incorporated by reference.

What is claimed is:

1. A lighting device comprising:
   a first substrate;
   a first light-emitting element and a second light-emitting element over the first substrate;
   a first insulating layer over the first light-emitting element and the second light-emitting element;
   a first plug and a second plug partially buried in opening portions of the first insulating layer;
   a first conductive layer over the first plug and the second plug; and
   a second substrate over the first plug the second plug; and
   a sealant between the first substrate and the second substrate,
   wherein the first light-emitting element and the second light-emitting element are electrically connected to each other through the first plug, the first conductive layer, and the second plug,
   wherein the first plug and the second plug each have a stacked-layer structure of a second conductive layer and a second insulating layer.

2. The lighting device according to claim 1, wherein an upper electrode of the first light-emitting element and a lower electrode of the second light-emitting element are electrically connected to each other through the first plug, the first conductive layer and the second plug.

3. The lighting device according to claim 1,
   wherein an upper electrode of the first light-emitting element and a lower electrode of the second light-emitting element are electrically connected to each other through the first plug, the first conductive layer and the second plug,
   wherein the first plug is electrically connected to the upper electrode and the second plug electrically is connected to the lower electrode,
   wherein the first plug is shared by the first light-emitting element and another light-emitting element, and
   wherein the first plug and the upper electrode of the first light-emitting element are electrically connected to each other through conductive particles.

4. The lighting device according to claim 1,
   wherein an upper electrode of the first light-emitting element and a lower electrode of the second light-emitting element are electrically connected to each other through the first plug, the first conductive layer and the second plug,
   wherein the first plug is electrically connected to the upper electrode and the second plug is electrically connected to the lower electrode, and
   wherein the second plug is shared by the first light-emitting element and another light-emitting element.

5. The lighting device according to claim 1,
   wherein an upper electrode of the first light-emitting element and a lower electrode of the second light-emitting element are electrically connected to each other through the first plug, the first conductive layer and the second plug, and
   wherein the upper electrode of the first light-emitting element and an upper electrode of the second light-emitting element are electrically connected to each other through the first plug, the first conductive layer and the second plug.

6. The lighting device according to claim 1,
   wherein the first light-emitting element has an organic compound layer, and
   wherein the organic compound layer is provided between a pair of electrodes and voltage is applied to the organic compound layer.

7. The lighting device according to claim 1,
   wherein an upper electrode of the first light-emitting element and a lower electrode of the second light-emitting element are electrically connected to each other through the first plug, the first conductive layer and the second plug, and
   wherein the lower electrode has a light-transmitting property so that light emitted from the light-emitting element is extracted from a first substrate side.

8. The lighting device according to claim 1, wherein the first light-emitting element and the second light-emitting element have circular shapes.

9. The lighting device according to claim 1, wherein the first light-emitting element and the second light-emitting element have polygonal shapes.

10. A lighting device comprising:
    a first substrate;
    a first light-emitting element and a second light-emitting element over the first substrate;
    an insulating layer over the first light-emitting element and the second light-emitting element;
    a first plug over an upper electrode of the first light-emitting element partially buried in a first opening portion of the insulating layer; and
    a second plug over a lower electrode of the second light-emitting element partially buried in a second opening portion of the insulating layer,
    a conductive layer over the first plug and the second plug;
    a second substrate over the conductive layer;
    wherein the upper electrode of the first light-emitting element is electrically connected to the lower electrode of the second light-emitting element through the first plug, the conductive layer, and the second plug.

11. The lighting device according to claim 10,
    wherein the first light-emitting element has an organic compound layer, and
    wherein the organic compound layer is provided between a pair of electrodes and voltage is applied to the organic compound layer.

12. The lighting device according to claim 10, wherein the lower electrode has a light-transmitting property so that light emitted from the light-emitting element is extracted from a first substrate side.

13. The lighting device according to claim 10, wherein the first light-emitting element and the second light-emitting element have circular shapes.

14. The lighting device according to claim 10, wherein the first light-emitting element and the second light-emitting element have polygonal shapes.

15. A lighting device comprising:
a first substrate;
a first light-emitting element and a second light-emitting element over the first substrate;
a first insulating layer over the first light-emitting element and the second light-emitting element;
a first plug and a second plug partially buried in opening portions of the first insulating layer;
a first conductive layer over the first plug and the second plug; and
a second substrate over the first plug and the second plug,
wherein the first light-emitting element and the second light-emitting element are electrically connected to each other in series through the first plug, the first conductive layer, and the second plug,
wherein the first plug and the second plug each have a stacked-layer structure of a second conductive layer and a second insulating layer.

16. The lighting device according to claim 15,
wherein the first light-emitting element has an organic compound layer, and
wherein the organic compound layer is provided between a pair of electrodes and voltage is applied to the organic compound layer.

17. The lighting device according to claim 15,
wherein an upper electrode of the first light-emitting element and a lower electrode of the second light-emitting element are electrically connected to each other through the first plug, the first conductive layer and the second plug, and
wherein the lower electrode has a light-transmitting property so that light emitted from the light-emitting element is extracted from a first substrate side.

18. The lighting device according to claim 15, wherein the first light-emitting element and the second light-emitting element have circular shapes.

19. The lighting device according to claim 15, wherein the first light-emitting element and the second light-emitting element have polygonal shapes.

* * * * *